United States Patent
Han et al.

(10) Patent No.: US 11,574,890 B2
(45) Date of Patent: Feb. 7, 2023

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Yi Seul Han, Incheon (KR); Tae Yong Lee, Gyeonggi-do (KR); Ji Yeon Ryu, Incheon (KR); Won Chul Do, Seoul (KR); Jin Young Khim, Seoul (KR); Shaun Bowers, Gilbert, AZ (US); Ron Huemoeller, Gilbert, AZ (US)

(73) Assignee: Amkor Technology Singapore Holding Pte. Lte., Singapore (SG)

( * ) Notice: Subject to any disclaimer, the term of this patent is extended or adjusted under 35 U.S.C. 154(b) by 28 days.

(21) Appl. No.: 16/918,074

(22) Filed: Jul. 1, 2020

(65) Prior Publication Data

US 2022/0005787 A1    Jan. 6, 2022

(51) Int. Cl.
| | |
|---|---|
| *H01L 23/48* | (2006.01) |
| *H01L 25/065* | (2006.01) |
| *H01L 23/498* | (2006.01) |
| *H01L 21/56* | (2006.01) |
| *H01L 23/538* | (2006.01) |
| *H01L 23/31* | (2006.01) |

(52) U.S. Cl.
CPC ........ *H01L 25/0655* (2013.01); *H01L 21/561* (2013.01); *H01L 21/563* (2013.01); *H01L 23/3128* (2013.01); *H01L 23/49822* (2013.01); *H01L 23/49833* (2013.01); *H01L 23/5385* (2013.01)

(58) Field of Classification Search
CPC . H01L 25/0655; H01L 21/561; H01L 21/563; H01L 23/3128; H01L 23/49822; H01L 23/49833; H01L 23/5385
See application file for complete search history.

(56) References Cited

U.S. PATENT DOCUMENTS

| | | | |
|---|---|---|---|
| 10,497,674 B2 | 12/2019 | Hiner et al. | |
| 2009/0236718 A1* | 9/2009 | Yang | H01L 25/105 257/E23.116 |
| 2015/0162220 A1* | 6/2015 | Chou | H01L 24/81 438/124 |
| 2017/0287874 A1* | 10/2017 | Fang | H01L 24/11 |
| 2019/0273030 A1* | 9/2019 | Lim | H01L 25/105 |
| 2020/0105544 A1* | 4/2020 | Tsai | H01L 24/73 |
| 2020/0219783 A1* | 7/2020 | Kim | H01L 23/49822 |
| 2020/0381404 A1* | 12/2020 | Mok | H01L 23/49811 |
| 2021/0175163 A1* | 6/2021 | Fang | H01L 21/561 |

* cited by examiner

*Primary Examiner* — Nicholas J Tobergte
(74) *Attorney, Agent, or Firm* — Spectrum IP Law Group LLC

(57) ABSTRACT

In one example, a semiconductor device comprises a first base substrate comprising a first base conductive structure, a first encapsulant contacting a lateral side of the first base substrate, a redistribution structure (RDS) substrate over the base substrate and comprising an RDS conductive structure coupled with the first base conductive structure, a first electronic component over the RDS substrate and over a first component terminal coupled with the RDS conductive structure, and a second encapsulant over the RDS substrate and contacting a lateral side of the first electronic component. Other examples and related methods are also disclosed herein.

16 Claims, 25 Drawing Sheets

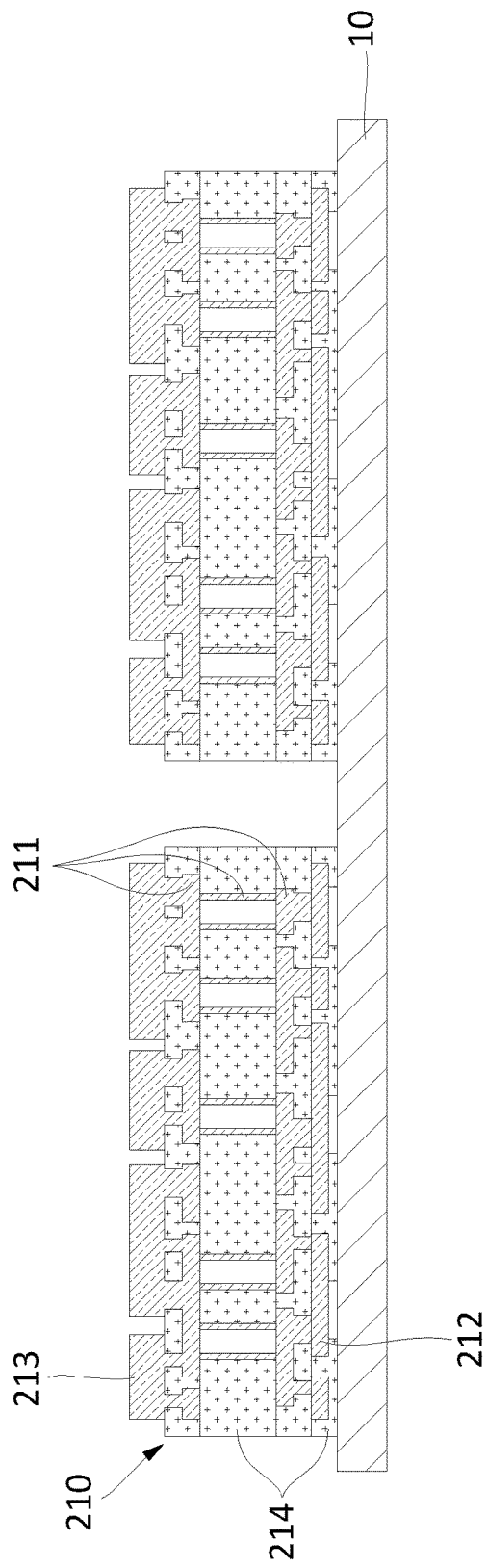
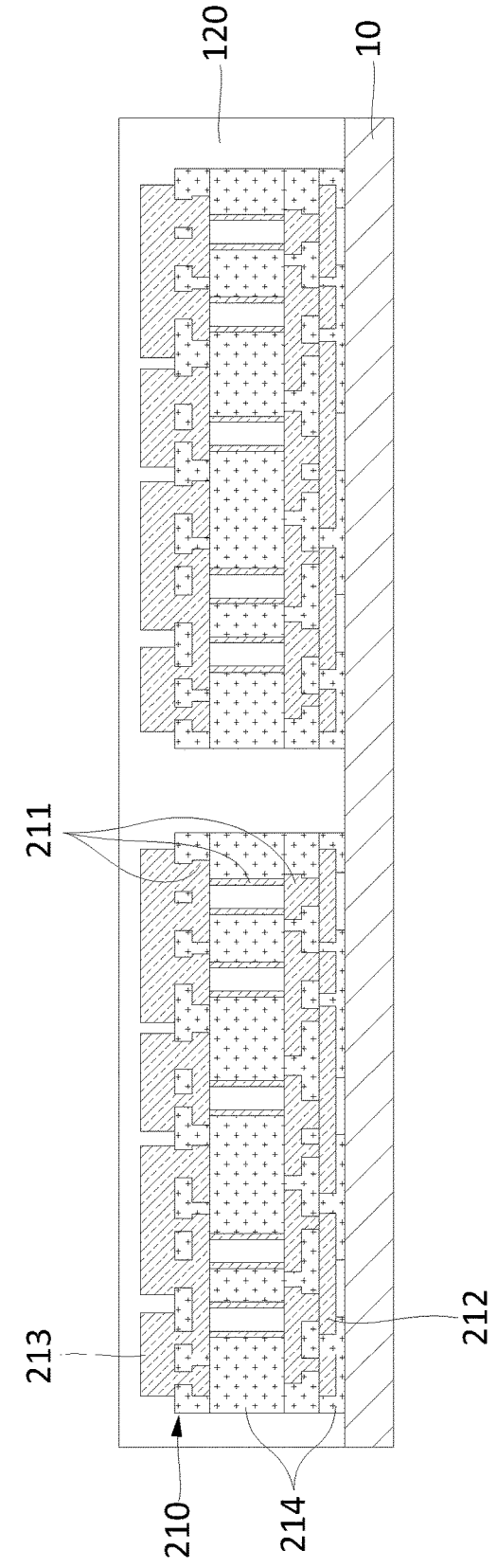
FIG.4A
FIG.4B

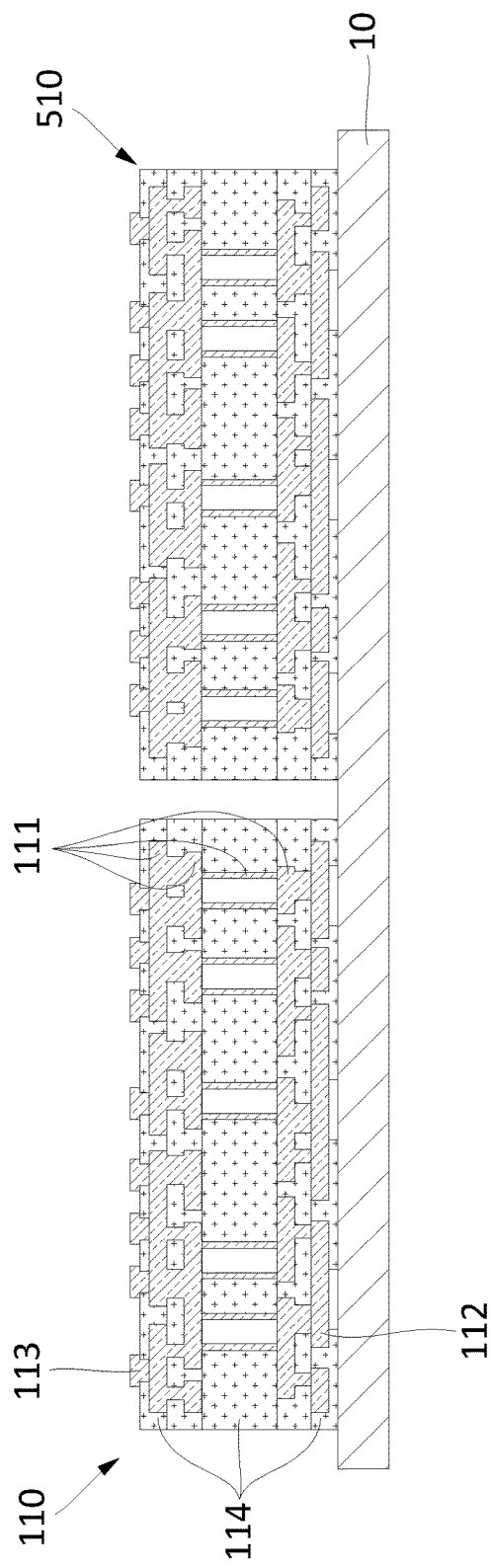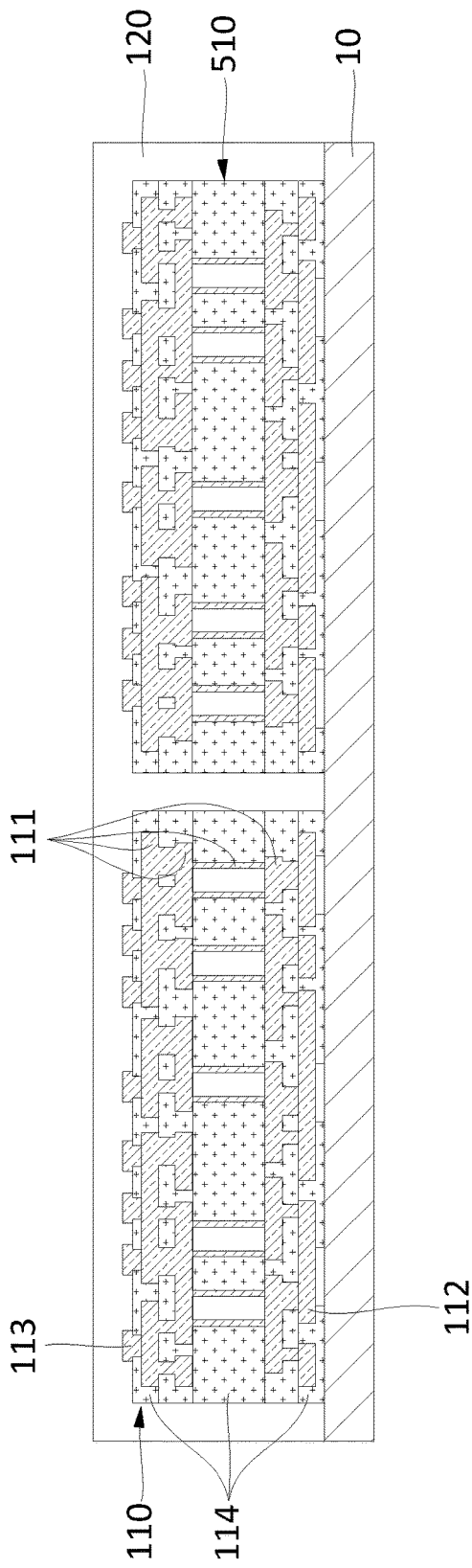

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 4A to 4F show cross-sectional views of an example method for manufacturing an example semiconductor device.

FIGS. 8A to 8F show cross-sectional views of an example method for manufacturing an example semiconductor device.

Figure 1:
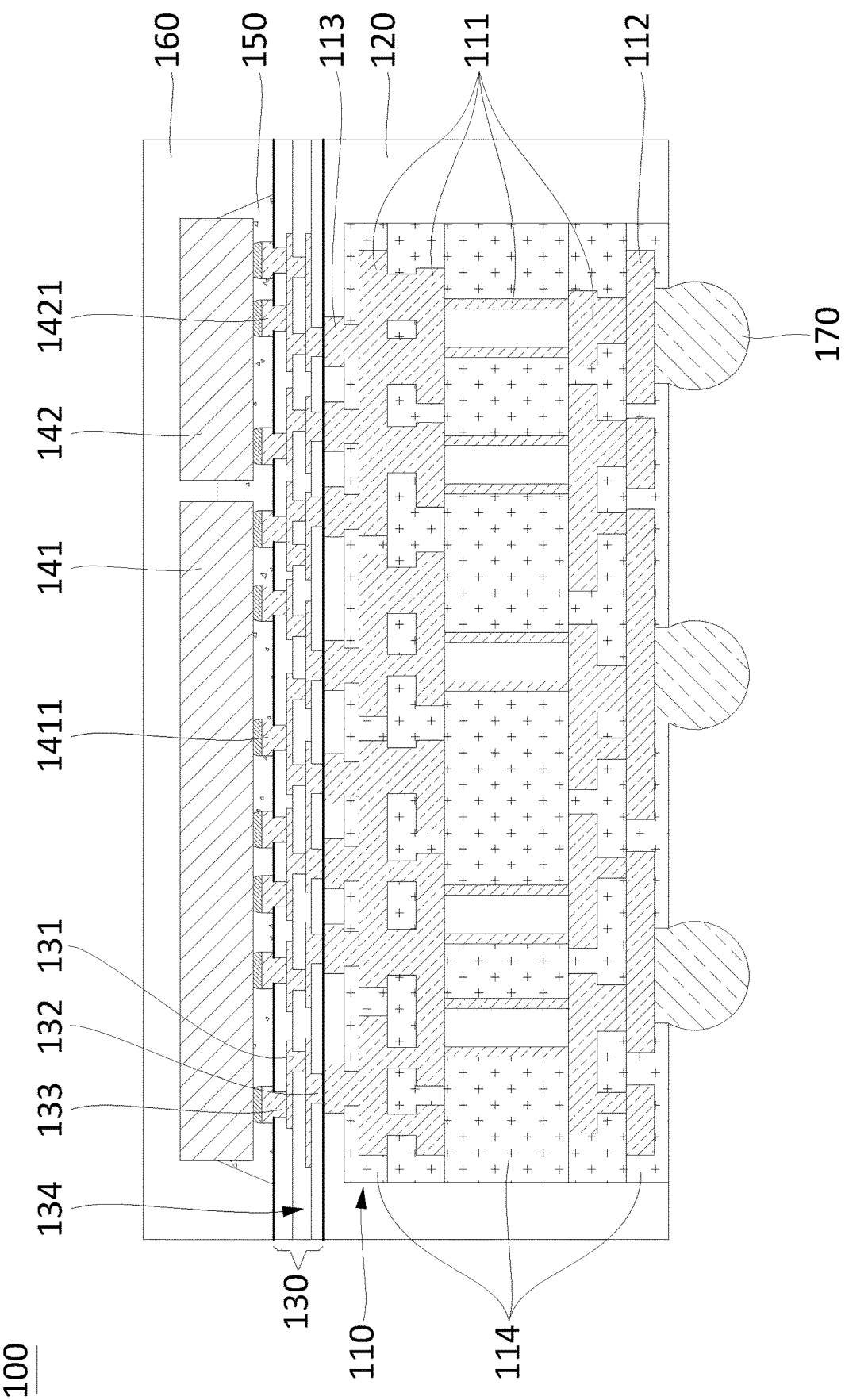
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), z), (x, y, z)}.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device comprises a first base substrate comprising a first base conductive structure, a first encapsulant contacting a lateral side of the first base substrate, a redistribution structure (RDS) substrate over the base substrate and comprising an RDS conductive structure coupled with the first base conductive structure, a first electronic component over the RDS substrate and over a first component terminal coupled with the RDS conductive structure, and a second encapsulant over the RDS substrate and contacting a lateral side of the first electronic component.

In another example, a semiconductor device comprises a first base substrate, a first encapsulant contacting a lateral side of the first base substrate, a redistribution structure (RDS) substrate over the first base substrate and comprising an RDS conductive structure, a first electronic component over the RDS substrate and over a first component terminal coupled with the RDS conductive structure, a second electronic component over the RDS substrate and over a second component terminal coupled with the RDS conductive structure, and a second encapsulant over the RDS conductive structure and contacting a lateral side of the first electronic component and the second electronic component.

In a further example, a method to manufacture a semiconductor device comprises providing a first base substrate comprising a first base conductive structure, providing a second base substrate comprising a second base conductive structure, providing a first encapsulant encapsulating the first base substrate and the second base substrate, wherein the first encapsulant contacts a lateral side of the first base substrate and a lateral side of the second base substrate, providing a redistribution structure (RDS) substrate comprising an RDS conductive structure, the RDS substrate located over the first base substrate and over the second base substrate, wherein the RDS conductive structure is coupled with the first base conductive structure and with the second base conductive structure, providing a first electronic component over a first component terminal over the first base substrate and a second electronic component over a second component terminal over the second base substrate, wherein the first component terminal is coupled with the RDS substrate, and the second component terminal is coupled with the RDS substrate, and providing a second encapsulant encapsulating the first electronic component and the second electronic component, wherein the second encapsulant contacts a lateral side of the first electronic component and a lateral side of the second electronic component.

Other examples are included in the present disclosure. Such examples may be found in the figures, in the claims, or in the description of the present disclosure.

FIG. 1 shows a cross-sectional view of an example semiconductor device. In the example shown in FIG. 1, semiconductor device 100 can comprise base substrate 110, encapsulants 120 or 160, redistribution structure (RDS) substrate 130, electronic components 141 or 142, underfill 150, and external interconnects 170. Encapsulant 120 can contact a lateral side of base substrate 110.

Base substrate 110 can comprise base conductive structure 111, base bottom terminal 112, base top terminal 113, and base dielectric structure 114. RDS substrate 130 can comprise RDS conductive structure 131, RDS bottom terminal 132, RDS top terminal 133, and RDS dielectric structure 134. First electronic component 141 can comprise first component terminal 1411, and second electronic component 142 can comprise second component terminal 1421. RDS substrate 130 can be over base substrate 110. Electronic component 141 can be over RDS substrate 130 and can be over first component terminal 1411. In some examples, first component terminal 1411 can be coupled with RDS conductive structure 131. In some examples, RDS conductive structure 131 can be coupled with RDS base conductive structure 111.

Base substrate 110, encapsulants 120 or 160, RDS substrate 130, underfill 150 and external interconnects 170 can be referred to as a semiconductor package or a package and can provide protection for electronic components 141 or 142 from external elements or environmental exposure. The semiconductor package can provide electrical couplings between an external component and electronic components 141 or 142. In some examples, encapsulant 160 can be over RDS substrate 130 and can contact a lateral side of electronic component 141 or electronic component 142. In some examples, RDS substrate 130 can cover an entire top side of base substrate 110.

Figure 2A:
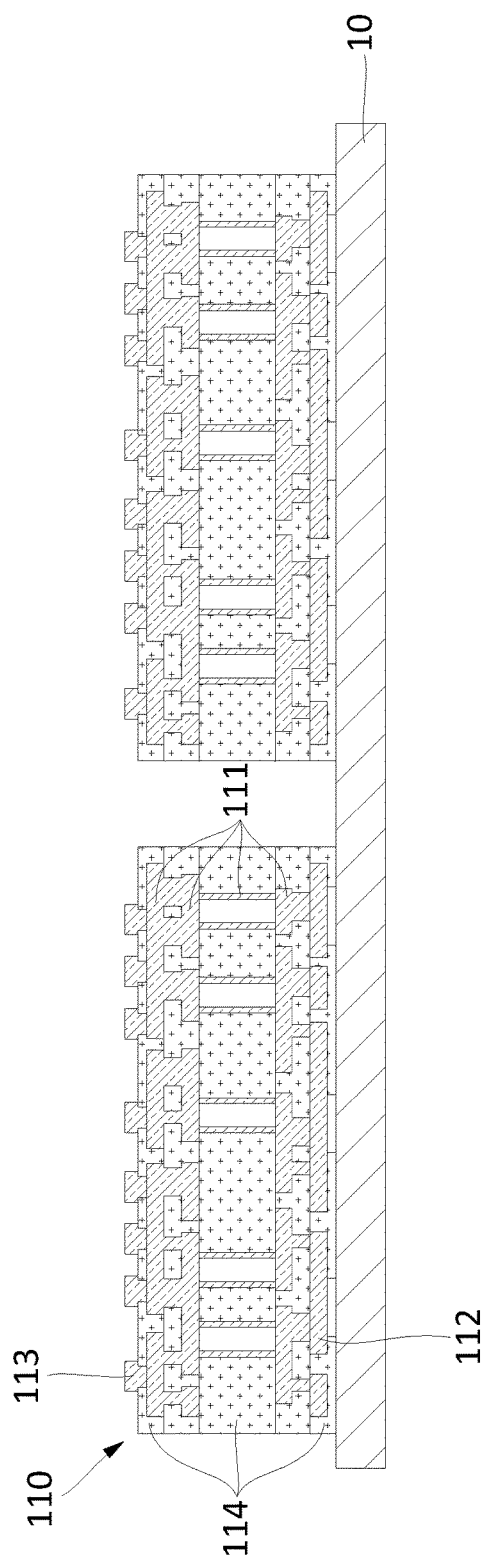
FIGS. 2A to 2F show cross-sectional views of an example method for manufacturing an example semiconductor device.

FIGS. 2A to 2F show cross-sectional views of an example method for manufacturing an example semiconductor device. FIG. 2A shows a cross-sectional view of semiconductor device 100 at an early stage of manufacture. In the example shown in FIG. 2A, base substrate 110 can be provided on a top side of carrier 10. In some examples, carrier 10 can comprise silicon, glass, a metal, an adhesive film, or an adhesive tape. In some examples, multiple base substrates 110 can be attached to the top side of carrier 10 through adhesive. In some examples, base substrate 110 can comprise or be referred to as a laminate substrate, a preformed substrate, a cored substrate, or a coarse-pitch substrate.

Base conductive structure 111 can comprise or be referred to as one or more traces, pads, vias, UBM vias, plated through holes, conductors, conductive materials, conductive patterns, conductive paths, conductive layers, redistribution layers (RDL), wiring patterns, trace patterns, or circuit patterns. Base conductive structure 111 can comprise an electrically conductive material, such as copper (Cu), aluminum (Al), palladium (Pd), titanium (Ti), tungsten (W), titanium/tungsten, nickel (Ni), gold (Au), or silver (Ag). Base conductive structure 111 can be provided by, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, the thickness of base conductive structure 111 can range from about 5 micrometers (μm) to about 100 μm. Base conductive structure 111 can transfer or redistribute signals, currents, or voltages in base substrate 110. In some examples, base conductive structure 111 can extend through base substrate 110 to couple base bottom terminals 112 and base top terminals 113 to each other.

Base bottom terminals 112 can be provided on a bottom side of base substrate 110 and can be coupled to base conductive structure 111. Base bottom terminals 112 can be considered part of base conductive structure 111. In some examples, base bottom terminals 112 can be partially exposed by base dielectric structure 114. In some examples, base bottom terminals 112 can comprise or be referred to as pads, bond pads, lands, under bump metallizations (UBMs), wiring layers, or metal layers. In some examples, base bottom terminals 112 can comprise an electrically conductive material, such as copper (Cu), aluminum (Al), palladium (Pd), titanium (Ti), tungsten (W), Ti/W, nickel (Ni), gold (Au), or silver (Ag). Base bottom terminals 112 can be provided by, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). Base bottom terminals 112 can provide electrical contacts between base conductive structure 111 and external interconnects 170. Base bottom terminals 112 can be coupled to base top terminals 113 through base conductive structure 111.

Base top terminals 113 can be provided on a top side of base substrate 110 and can be coupled to base conductive structure 111. Base top terminals 113 can be considered part of base conductive structure 111. In some examples, base top terminals 113 can be partially exposed by base dielectric structure 114. In some examples, base top terminals 113 can comprise or be referred to as pads, bond pads, lands, under bump metallizations (UBMs), wiring layers, metal layers, studs, posts, or bumps. In some examples, base top terminals 113 can comprise an electrically conductive material, such as copper (Cu), aluminum (Al), palladium (Pd), titanium (Ti), tungsten (W), Ti/W, nickel (Ni), gold (Au), or silver (Ag). For example, base top terminals 113 can be provided by sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). Base top terminals 113 can provide electrical contact between base conductive structure 111 and RDS substrate 130. Base top terminals 113 can be coupled to base bottom terminals 112 through base conductive structure 111.

Base dielectric structure 114 can comprise or be referred to as one or more dielectrics, dielectric materials, dielectric layers, passivation layers, insulation layers, protection layers, solder mask layers, solder resist layers, or prepreg layers. In some examples base dielectric structure 114 can comprise one or more core structures, such as core layer 114a, having structural integrity elements, such as fiber strands or filler particles. Base dielectric structure 114 can comprise an electrically non-conductive material, such as polymer, polyimide (PI), polypropylene (PP), polyethylene (PE), benzocyclobutene (BCB), polybenzoxazole (PBC)), bismaleimide triazine (BT), a molding material, inorganic filler, a phenol resin, epoxy, silicone, acrylate polymer, or fiberglass strands. In some examples, base dielectric structure 114 can be provided by thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, spin coating, spray coating, sintering, or evaporating. In some examples, the thickness of base dielectric structure 114 can range from about 0.01 millimeter (mm) to about 1.5 mm. Base dielectric structure 114 can provide protection for base conductive structure 111, base bottom terminals 112 and base top terminals 113 from external elements or environmental exposure, and can provide insulation between different portions of base conductive structure 111, base bottom terminals 112, or base top terminals 113. In some examples, base dielectric structure 114 can expose portions of base bottom terminals 112 to a bottom side of base substrate 110, and can expose portions of base top terminals 113 to a top side of base substrate 110. In some examples, topmost or bottommost layers of base dielectric structure 114 can comprise or be referred to as solder mask. In some examples, the thickness of base substrate 110 can range from about 0.1 mm to about 3.0 mm.

In some examples, base substrate 110 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as a dielectric material comprising bismaleimide triazine (BT) or FR4, and dielectric and conductive layers can be formed on the permanent core structure. In other examples, the pre-formed substrate can be a coreless substrate and can omit the permanent core structure, and the dielectric and conductive layers can be formed on a sacrificial carrier and can be removed after formation of the dielectric and conductive layers and before attachment to the electronic device. The pre-formed substrate can referred to as a printed circuit board (PCB) or a laminate substrate. Such a pre-formed substrate can be formed through a semi-additive or modified-semi-additive process. Other substrates in this disclosure can also comprise a pre-formed substrate.

Figure 2B:
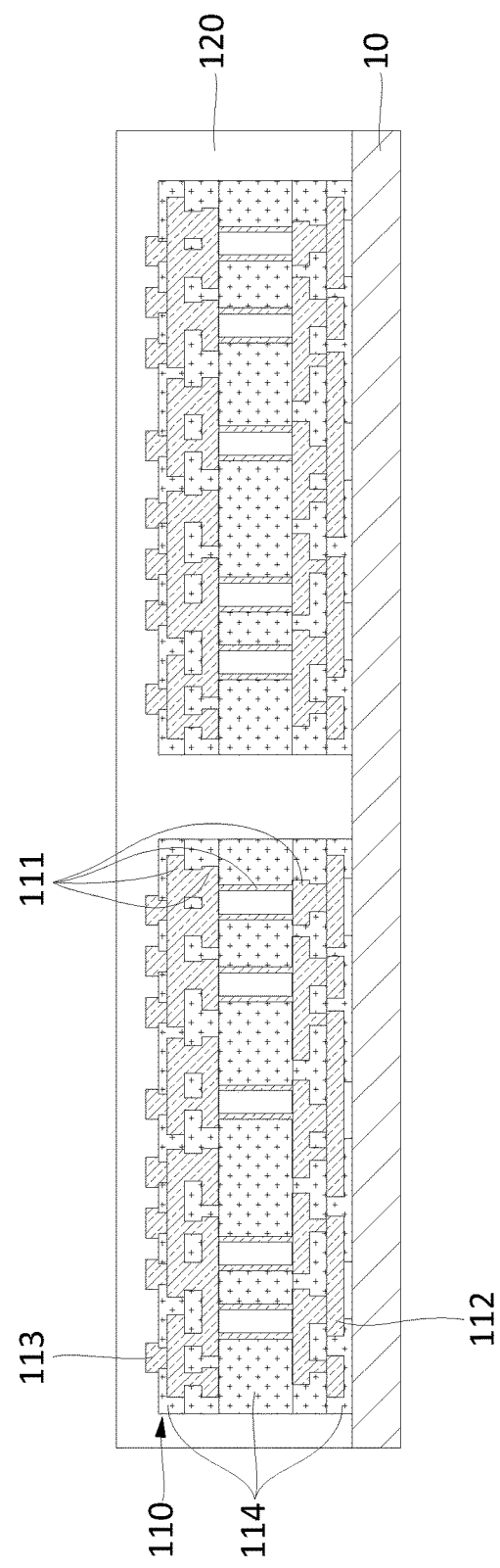

FIG. 2B shows a cross-sectional view of semiconductor device 100 at a later stage of manufacture. In the example shown in FIG. 2B, encapsulant 120 can encapsulate at once multiple base substrates 110 above carrier 10. Encapsulant 120 can be provided to encapsulate lateral sides and top sides of base substrates 110. In some examples, encapsulant 120 can encapsulate base top terminals 113 exposed at the top sides of base substrates 110. In some examples, encapsulant 120 can contact a top side of base substrate 110.

In some examples, encapsulant 120 can comprise or be referred to as a protective material, a dielectric, a mold compound, or a package body. Encapsulant 120 can comprise a variety of encapsulating or molding materials, such as a resin, a polymeric compound, a polymer having fillers, an epoxy resin, an epoxy resin having fillers, epoxy acrylate having fillers, a silicon resin, combinations, equivalents, or similar compounds. In some examples, the fillers can comprise inorganic material such as glass. Encapsulant 120 can be provided by a variety of processes, for example, a compression molding process, an injection molding process, a transfer molding process, a liquid phase encapsulant molding process, a vacuum lamination process, a paste printing process, or a film assisted molding process. The thickness of encapsulant 120 can range from about 0.05 mm to about 2.0 mm. Encapsulant 120 can protect base substrate 110 from external elements. In some examples, since encapsulant 120 encapsulates lateral sides of base substrate 110, a package having a fan-out structure located on base substrate 110 can be fabricated.

Figure 2C:
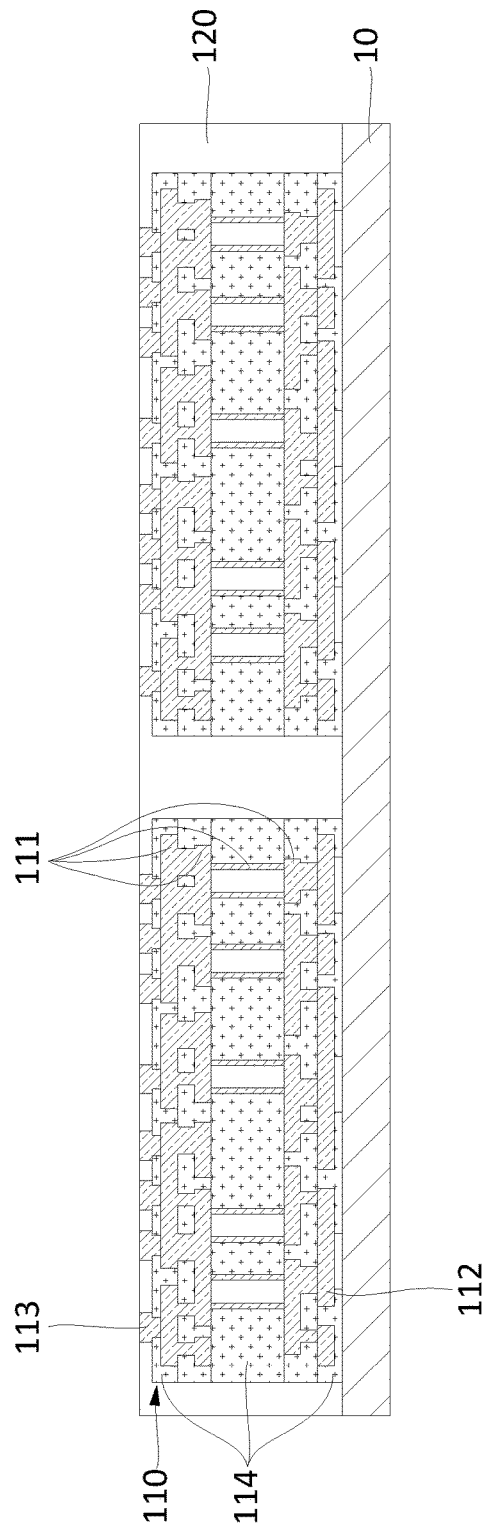

FIG. 2C shows a cross-sectional view of semiconductor device 100 at a later stage of manufacture. In the example shown in FIG. 2C, base top terminals 113 can be exposed by removing a top portion of encapsulant 120. In some examples, the top portion of encapsulant 120 can be removed by grinding or etching. In some examples, base top terminals 113 can remain exposed when encapsulant 120 is applied in FIG. 2B, such as when a film-assisted molding process is used, avoiding the need to subsequently expose them. In some examples, top sides of base top terminals 113 can be substantially coplanar with the top side of encapsulant 120. In some examples, the top portion of encapsulant 120 can be removed prior to providing RDS substrate 130 as discussed below.

Figure 2D:
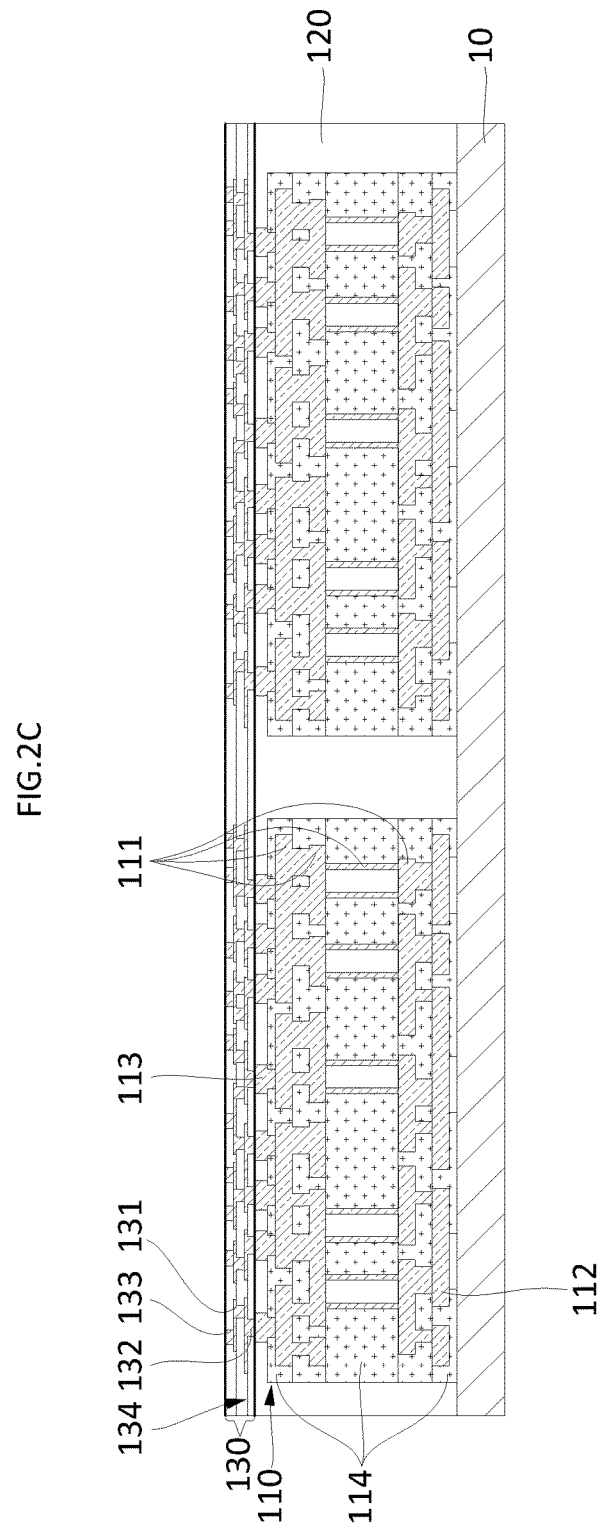

FIG. 2D shows a cross-sectional view of semiconductor device 100 at a later stage of manufacture. In the example shown in FIG. 2D, RDS substrate 130 can be provided on encapsulant 120. RDS substrate 130 can comprise RDS conductive structure 131. In some examples, RDS substrate 130 can be provided on the entire top side of encapsulant 120 encapsulating multiple base substrates 110. RDS conductive structure 131 can be coupled with base conductive structures 111 of multiple base substrates 110. In some examples, RDS substrate 130 can comprise or be referred to as a redistribution layer (RDL) substrate, a buildup substrate, a coreless substrate, a thin-film substrate, a fine-pitch substrate, or a high routing density substrate. RDS substrate 130 can be provided as electrical connection structure between base substrate 110 and electronic components 141 and 142. In some examples, RDS substrate 130 can extend beyond the footprint defined by lateral sides of base substrate 110 to form a fan-out redistribution structure. In some examples, the thickness of RDS substrate 130 can range from about 5 μm to about 50 μm.

RDS substrate 130 can provide a finer pitch or higher routing density than the coarser pitch or lower routing density of base substrate 110. In some examples, a fine pitch of RDS conductive structure 131 or of RDS top terminals 133 can range from about 1.0 μm to about 20 μm. In some examples, a coarse pitch of base conductive structure 111 or of base top terminals 113 can range from about 20 μm to about 50 μm.

RDS conductive structure 131 can comprise or be referred to as one or more traces, pads, vias, UBM vias, conductors, conductive materials, conductive patterns, conductive paths, conductive layers, redistribution layers (RDL), wiring patterns, trace patterns, or circuit patterns. RDS conductive structure 131 can comprise, for example, an electrically conductive material such as copper (Cu), aluminum (Al), palladium (Pd), titanium (Ti), tungsten (W), Ti/W, nickel (Ni), gold (Au), or silver (Ag). RDS conductive structure 131 can be provided by, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). In some examples, the thickness of RDS conductive structure 131 can range from about 5 µm to about 50 µm. Conductive structure 131 can transfer or redistribute signals, currents, or voltages in RDS substrate 130.

RDS bottom terminals 132 can be provided on a bottom side of RDS substrate 130 and can be coupled to or part of RDS conductive structure 131. In some examples, RDS bottom terminals 132 can contact base top terminals 113 of base substrate 110 to electrically couple RDS substrate 130 to base substrate 110. In some examples, RDS bottom terminals 132 can comprise or be referred to as pads, bond pads, lands, under bump metallizations (UBMs), wiring layers, or metal layers. In some examples, RDS bottom terminals 132 can comprise an electrically conductive material, such as copper (Cu), aluminum (Al), palladium (Pd), titanium (Ti), tungsten (W), Ti/W, nickel (Ni), gold (Au), or silver (Ag). RDS bottom terminal 132 can be provided by, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). RDS bottom terminals 132 can provide electrical contact between RDS conductive structure 131 and base substrate 110.

RDS top terminals 133 can be provided on a top side of RDS substrate 130 and can be coupled to or part of RDS conductive structure 131. In some examples, portions of RDS top terminals 133 can be exposed by RDS dielectric structure 134. In some examples, RDS top terminals 133 can comprise or be referred to as pads, bond pads, lands, under bump metallizations (UBMs), wiring layers, metal layers, studs, posts or bumps. In some examples, RDS top terminals 133 can comprise an electrically conductive material, such as copper (Cu), aluminum (Al), palladium (Pd), titanium (Ti), tungsten (W), Ti/W, nickel (Ni), gold (Au), or silver (Ag). RDS top terminals 133 can be provided by, for example, sputtering, electroless plating, electroplating, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). RDS top terminals 133 can provide electrical contacts between RDS conductive structure 131 and electronic components 141 and 142.

RDS dielectric structure 134 can comprise or be referred to as one or more dielectrics, dielectric materials, dielectric layers, passivation layers, insulation layers, or protection layers. RDS dielectric structure 134 can comprise an electrically non-conductive material, such as polymer, polyimide (PI), polypropylene (PP), polyethylene (PE), benzocyclobutene (BCB), polybenzoxazole (PBO), bismaleimide triazine (BT), a molding material, a phenol resin, epoxy, silicone or acrylate polymer. In some examples, RDS dielectric structure 134 can be provided by, for example thermal oxidation, chemical vapor deposition (CVD), physical vapor deposition (PVD), atomic layer deposition (ALD), low pressure chemical vapor deposition (LPCVD), plasma enhanced chemical vapor deposition (PECVD), sheet lamination, printing, spin coating, spray coating, sintering, or evaporating. In some examples, the thickness of RDS dielectric structure 134 can range from about 5 µm to about 50 µm. RDS dielectric structure 134 can protect RDS conductive structure 131 from external elements and provide insulation between different portions of RDS conductive structure 131. RDS dielectric structure 134 can expose portions of RDS top terminals 133 to the top side of RDS substrate 130.

RDS substrate 130 can be a redistribution layer ("RDL") substrate. In some examples, RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as an electroplating process or an electroless plating process. The conductive patterns can comprise an electrically conductive material such as copper or other plateable metal. The locations of the conductive patterns can be made using a photo-patterning process such as a photolithography process and a photoresist material to form a photolithographic mask. The dielectric layers of the RDL substrate can be patterned with a photo-patterning process which can include a photolithographic mask through which light is exposed at photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer or layers can comprise silicon nitride (Si3N4), silicon oxide (SiO2), or silicon oxynitride (SiON). The inorganic dielectric layer or layers can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate. Other substrates in this disclosure can also comprise an RDL substrate.

Figure 2E:
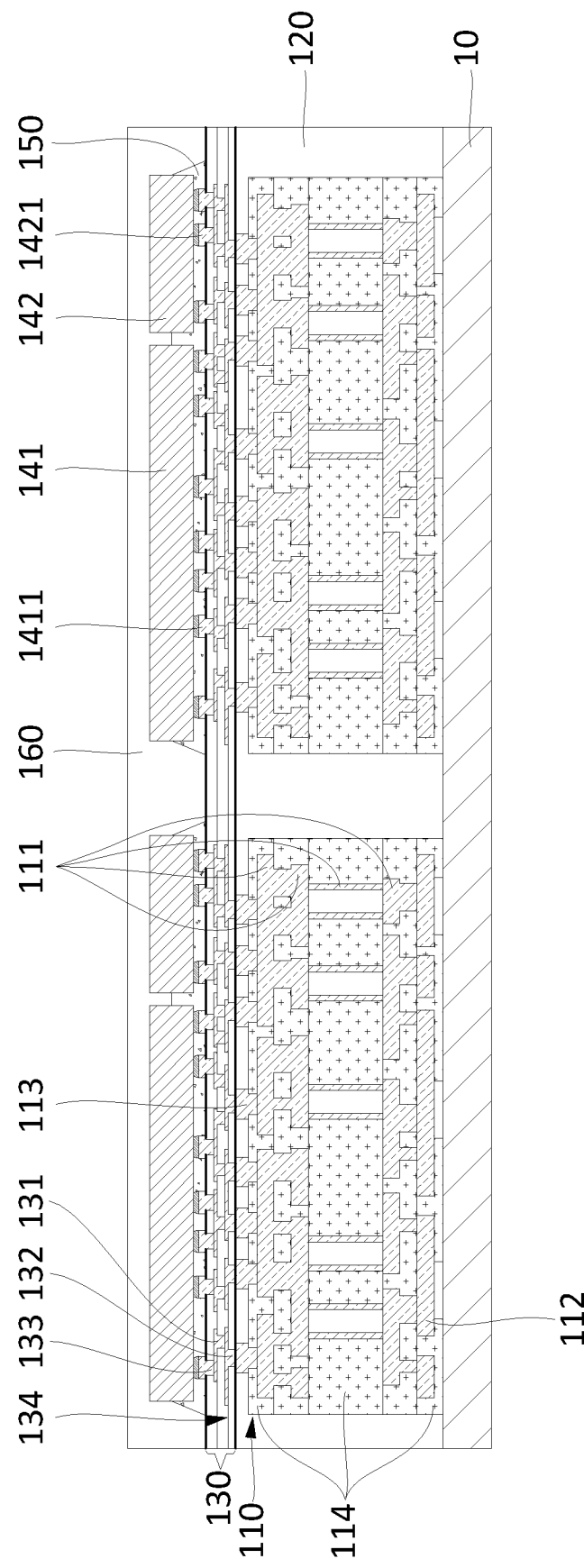

FIG. 2E shows a cross-sectional view of semiconductor device 100 at a later stage of manufacture. In the example shown in FIG. 2E, electronic components 141 and 142 can be attached to RDS substrate 130. In some examples, first electronic component 141 and second electronic component 142 can be coupled to RDS top terminals 133 of RDS substrate 130. In some examples, first electronic component 141 and second electronic component 142 can be separated from each other to be positioned on one single base substrate 110.

In some examples, first electronic component 141 can comprise or be referred to as a semiconductor die, a semiconductor chip, or a semiconductor package such as a chip scale package. First electronic component 141 can comprise a semiconductor material, for example silicon (Si). First electronic component 141 can comprise passive devices such as capacitors, or active devices such as transistors. First electronic component 141 can comprise, for example, electrical circuits such as a memory, a controller, a digital signal processor (DSP), a microprocessor, a network processor, a power management processor, an audio processor, a radio-frequency (RF) circuit, a wireless baseband system-on-chip (SoC) processor, a sensor, or an application specific integrated circuit (ASIC). In some examples, first electronic component 141 can be coupled to RDS top terminals 133 by, for example, a mass reflow process, a thermal compression process or a laser assisted bonding process. The thickness of first electronic component 141 can range from about 30 μm to about 800 μm.

First electronic component 141 can comprise first component terminals 1411. First component terminals 1411 can be provided at a bottom side of first electronic component 141. First component terminals 1411 can be coupled to RDS top terminals 133. In some examples, first component terminals 1411 can comprise pads, lands, conductive balls such as solder balls, conductive posts such as copper pillars or pillars having solder tips, or conductive bumps. First component terminals 1411 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. First component terminals 1411 can be provided by, for example, a ball drop process, a screen-printing process, or an electroplating process. The height of first component terminals 1411 can range from about 10 μm to about 100 μm.

In some examples, second electronic component 142 can comprise or be referred to as a semiconductor die, a semiconductor chip, or a semiconductor package such as a chip scale package. Second electronic component 142 can comprise a semiconductor material, for example silicon (Si). Second electronic component 142 can comprise passive devices such as capacitors, or active devices such as transistors. Second electronic component 142 can comprise, for example, electrical circuits, such as a memory, a controller, a digital signal processor (DSP), a microprocessor, a network processor, a power management processor, an audio processor, a radio-frequency (RF) circuit, a wireless baseband system-on-chip (SoC) processor, a sensor, or an application specific integrated circuit (ASIC). In some examples, second electronic component 142 can be coupled to RDS top terminals 133 by, for example, a mass reflow process, a thermal compression process, or a laser assisted bonding process. The thickness of second electronic component 142 can range from about 30 μm to about 800 μm.

Second electronic component 142 can comprise second component terminals 1421. Second component terminals 1421 can be provided at a bottom side of second electronic component 142. Second component terminals 1421 can be coupled to RDS top terminals 133. In some examples, second component terminals 1421 can comprise pads, lands, conductive balls, such as solder balls, conductive posts such as copper pillars or pillars having solder tips, or conductive bumps. Second component terminals 1421 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. Second component terminals 1421 can be provided by, for example, a ball drop process, a screen-printing process, or an electroplating process. The height of second component terminals 1421 can range from about 10 μm to about 100 μm.

In the example shown in FIG. 2E, underfill 150 optionally can be provided between electronic components 141 and 142 and RDS substrate 130. Underfill 150 can cover first component terminals 1411, second component terminals 1421, and RDS top terminals 133. In some examples, underfill 150 can comprise or be referred to as a protective material, a dielectric, or a mold compound. In some examples, underfill 150 can comprise epoxy, a thermoplastic material, a thermocurable material, polyimide, polyurethane, a polymeric material, filled epoxy, a filled thermoplastic material, a filled thermocurable material, filled polyimide, filled polyurethane, a filled polymeric material or fluxing underfill. The thickness of underfill 150 can range from about 0.02 mm to about 0.2 mm.

In some examples, encapsulant 160 optionally can encapsulate electronic components 141 and 142. Encapsulant 160 can encapsulate top sides or lateral sides of electronic components 141 and 142. In some examples, after encapsulating top and lateral sides of electronic components 141 and 142, top sides of electronic components 141 and 142 can be exposed by grinding a top portion of encapsulant 160. In some examples, underfill 150 can be provided prior to providing encapsulant 160.

In some examples, encapsulant 160 can comprise or be referred to as a protective material, a dielectric, a mold compound, or a package body. Encapsulant 160 can comprise a variety of encapsulating or molding materials, for example a resin, a polymeric compound, a polymer having fillers, an epoxy resin, an epoxy resin having fillers, epoxy acrylate having fillers, a silicon resin, combinations, equivalents, or the like. Encapsulant 160 can be provided by a variety of processes, for example a compression molding process, an injection molding process, a transfer molding process, a liquid phase encapsulant molding process, a vacuum lamination process, a paste printing process, or a film assisted molding process. In some examples, underfill 150 can be a molded underfill or can comprise a portion of the same layer as encapsulant 160. The thickness of encapsulant 160 can range from about 0.05 mm to about 1.5 mm.

Figure 2F:
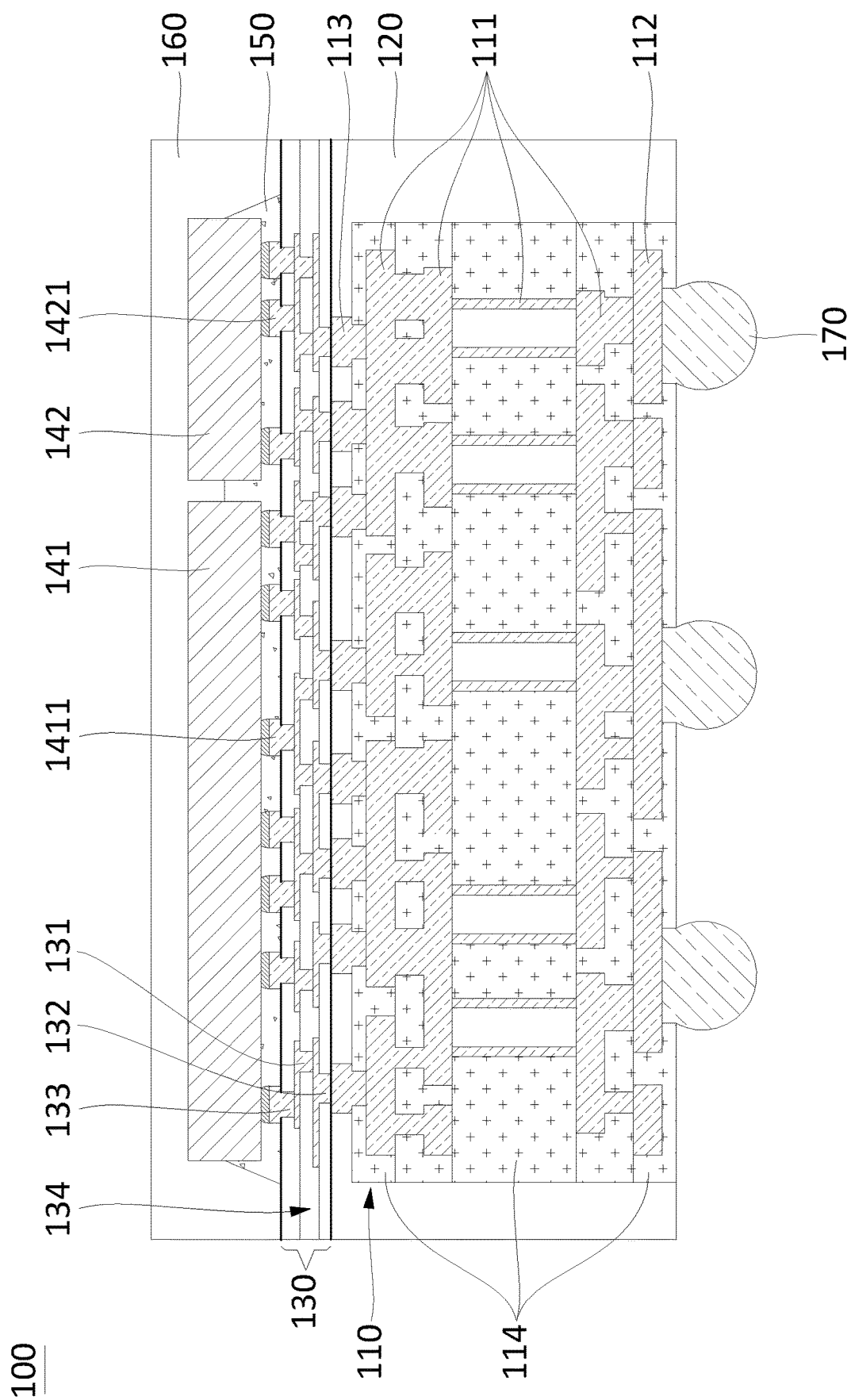

FIG. 2F shows a cross-sectional view of semiconductor device 100 at a later stage of manufacture. In the example shown in FIG. 2F, carrier 10 positioned under base substrate 110 can be removed or separated. In some examples, carrier 10 can be removed or separated from base substrate 110 by grinding, heating, etching, light, ultraviolet (UV) rays, or a physical force. With carrier 10 removed, base bottom terminals 112 of base substrate 110 can be exposed.

In the example shown in FIG. 2F, external interconnects 170 can be coupled to exposed base bottom terminals 112, and encapsulants 120 and 160 and RDS substrate 130 can be together subjected to sawing or singulation to provide individual semiconductor devices 100. In some examples, the sawing can be performed using a sawing tool such as a diamond blade or laser beam. In some examples, encapsulants 120 and 160 and RDS substrate 130 can first be subjected to sawing or singulation between adjacent base substrates 110, and external interconnects 170 can be coupled to base bottom terminals 112, to provide individual semiconductor devices 100.

In some examples, external interconnects 170 can comprise conductive bumps, balls, or pillars such as posts or wires, and can comprise, for example, solder bodies, copper bodies, or solder caps. External interconnects 170 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. External interconnects 170 can be provided by, for example, a ball drop process, a screen-printing process, or an electroplating process. The thickness of external interconnects 170 can range from about 100 μm to about 800 μm. External interconnects 170 can provide electrical connection paths between semiconductor device 100 and external components.

Figure 3:
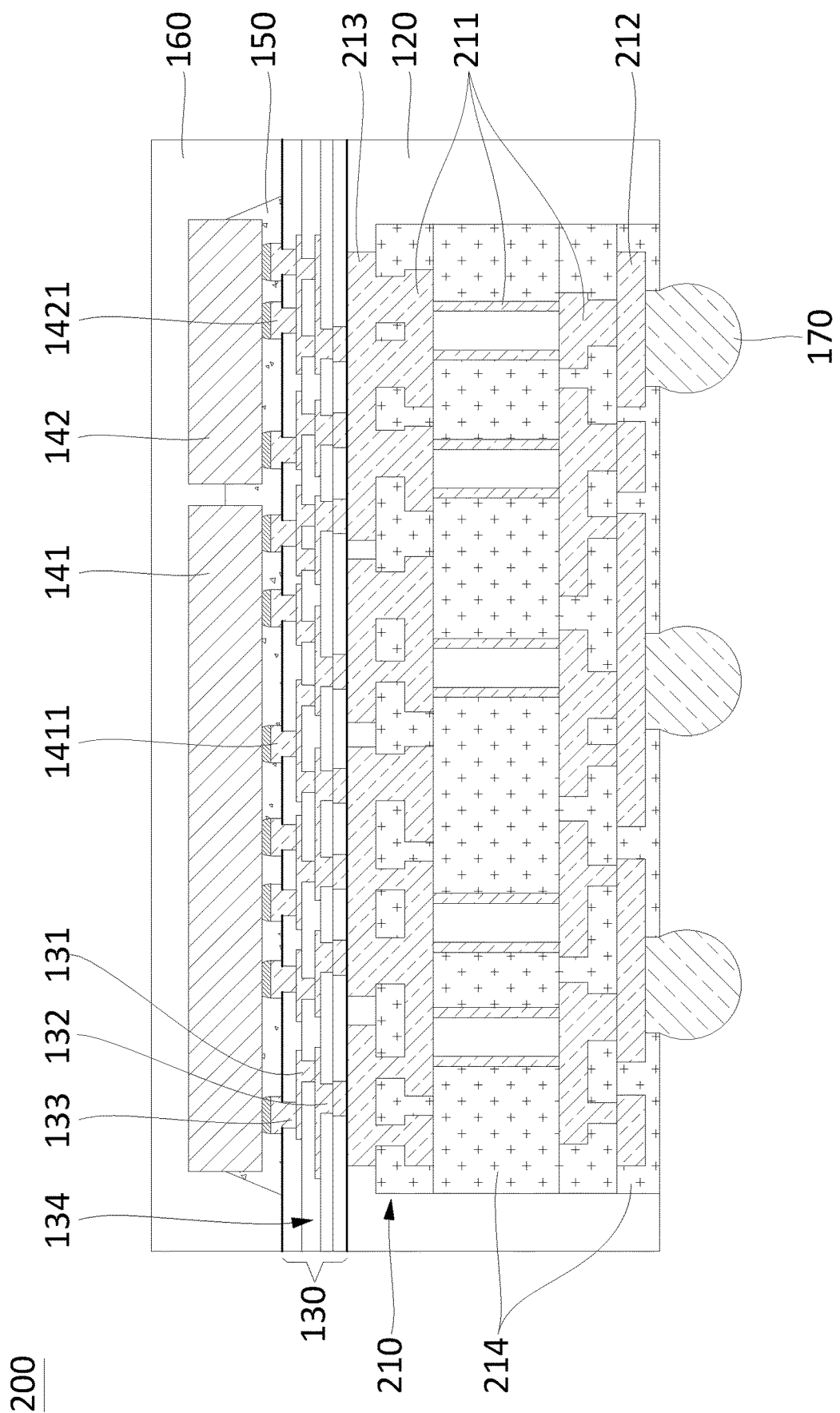
FIG. 3 shows a cross-sectional view of an example semiconductor device.

FIG. 3 shows a cross-sectional view of an example semiconductor device 200. In the example shown in FIG. 3, semiconductor device 200 can comprise base substrate 210, encapsulants 120 and 160, RDS substrate 130, electronic components 141 and 142, underfill 150 and external interconnects 170. In some examples, semiconductor device 200 can comprise corresponding elements, features, materials, or formation processes similar to those of other semiconductor device described in this disclosure, such as semiconductor device 100.

Base substrate 210 can comprise base conductive structure 211, base bottom terminals 212, base top terminals 213, and base dielectric structure 214. In some examples, base substrate 210 can comprise corresponding elements, features, materials, or formation processes similar to those of base substrate 110 previously described. For example, items 211, 212, 213, or 214 of base substrate 210 can respectively correspond or be similar to items 111, 112, 113, or 114 of base substrate 110 previously described.

In some examples, the top of base dielectric structure 214 of base substrate 210 can omit a solder mask layer. In some examples, the topmost conductive layer of base conductive structure 211 can comprise one or more thickened RDL traces that have top side and lateral side exposed from base dielectric structure 214. In some examples, the topmost conductive layer of base conductive structure 211 can comprise a greater thickness than other inferior conductive layer of base conductive structure 211.

In some examples, base substrate 210, encapsulants 120 and 160, RDS substrate 130, underfill 150, and external interconnects 170 can be referred to as a semiconductor package or a package and can provide protection for electronic components 141 and 142 from external elements or environmental exposure. The semiconductor package can provide electrical couplings between an external component and electronic components 141 and 142.

Figure 4C:
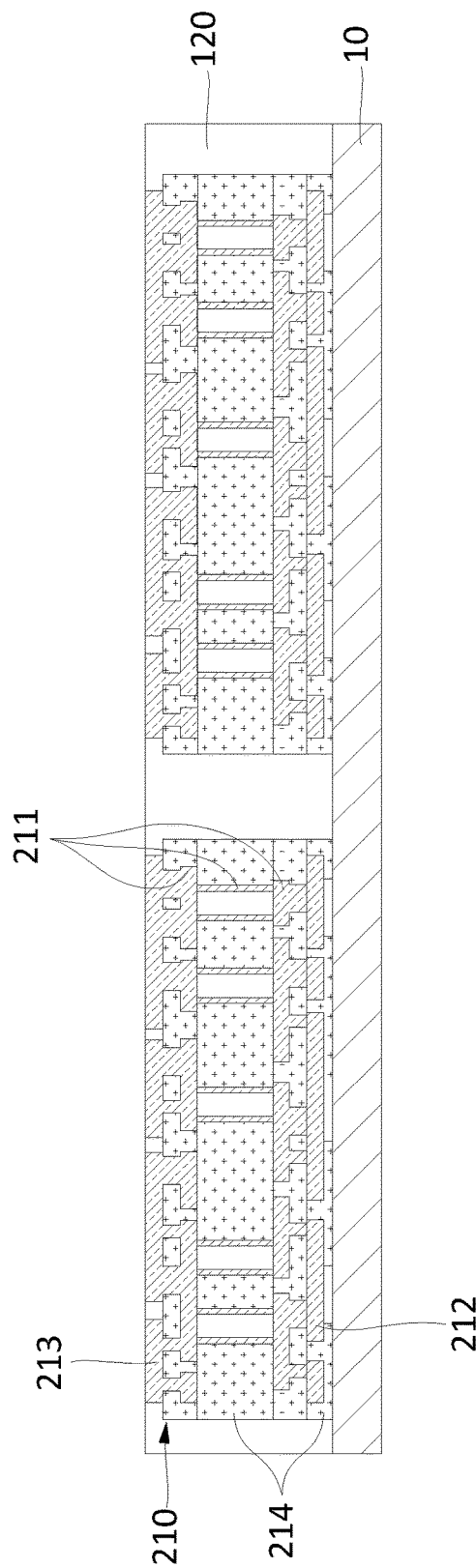

FIGS. 4A to 4F show cross-sectional views of an example method for manufacturing an example semiconductor device. FIG. 4A shows a cross-sectional view of semiconductor device 200 at an early stage of manufacture. In some examples, the stage of FIG. 4A can correspond to or be similar to the stage described with respect to FIG. 2A. In the example shown in FIG. 4A, base substrate 210 can be provided on a top side of carrier 10. Base substrate 210 can be similar to base substrate 110 described above. In some examples, carrier 10 can comprise silicon, glass, a metal, an adhesive film, or an adhesive tape. In some examples, multiple base substrates 210 can be attached to the top side of carrier 10 through adhesive. In some examples, base substrate 210 can comprise or be referred to as a laminate substrate, a pre-formed substrate, or a coarse-pitch substrate. In some examples, base substrate 210 can be a structure without a solder mask layer positioned at the top layer of base dielectric structure 214.

Base conductive structure 211 can transfer or redistribute signals, currents or voltages in base substrate 210. In some examples, base conductive structure 211 can extend through base substrate 210 to couple base bottom terminals 212 to base top terminals 213. In some examples, base conductive structure 211 can comprise corresponding elements, features, materials, or formation processes similar to those of base conductive structure 111 previously described.

Base bottom terminals 212 can be provided on a bottom side of base substrate 210 and can be coupled to or part of base conductive structure 211. In some examples, base bottom terminals 212 can be partially exposed by base dielectric structure 214. In some examples, base bottom terminals 212 can comprise corresponding elements, features, materials, or formation processes similar to those of base bottom terminals 112 previously described.

Base top terminals 213 can be provided on a top side of base substrate 210 and can be coupled to or part of base conductive structure 211. In some examples, base top terminals 213 can be provided together with base conductive structure 211 and can be portions of base conductive structure 211. In some examples, base top terminals 213 can be thicker than base top terminals 113 shown in FIG. 2A. In some examples, base top terminals 213 can comprise or be referred to as pads, bond pads, lands, wiring layers, or metal layers. In some examples, base top terminals 213 can comprise corresponding elements, features, materials, or formation processes similar to those of base top terminals 113 previously described. In some examples, the thicknesses of base top terminals 213 can range from about 5 μm to about 100 μm. In some examples, the substrate top terminals 213 can comprise one or more thickened RDL traces that have a top side and a lateral side exposed from base dielectric structure 214. In some examples, base top terminals 213 can comprise RDL traces that have a greater thickness than other conductive layers of base conductive structure 211.

Base dielectric structure 214 can comprise or be referred to as one or more dielectrics, dielectric materials, dielectric layers, passivation layers, insulation layers, protection layers, core layers, or prepreg layers. In some examples, base dielectric structure 214 can comprise corresponding elements, features, materials, or formation processes similar to those of base dielectric structure 114 previously described. Base dielectric structure 214 can be a structure without a topmost solder mask layer. In some examples, thicknesses of base dielectric structure 214 can range from about 0.01 mm to about 1.5 mm.

FIG. 4B shows a cross-sectional view of semiconductor device 200 at a later stage of manufacture. In some examples, the stage of FIG. 4B can correspond to or be similar to the stage described with respect to FIG. 2B. In the example shown in FIG. 4B, encapsulant 120 can encapsulate at once multiple base substrates 210 from above carrier 10. Encapsulant 120 can encapsulate base top terminals 213 exposed at the top sides of base substrates 210.

FIG. 4C shows a cross-sectional view of semiconductor device 200 at a later stage of manufacture. In some examples, the stage of FIG. 4C can correspond to or be similar to the stage described with respect to FIG. 2C. In the example shown in FIG. 4C, base top terminals 213 can be exposed by removing a top portion of encapsulant 120. Portions of base top terminals 213 can be removed together with encapsulant 120, thereby providing base top terminals 213 having a reduced thickness. In some examples, encapsulant 120 and portions of base top terminals 213 can be removed by grinding or etching. In some examples, top sides of base top terminals 213 can be substantially coplanar with the top side of encapsulant 120.

Figure 4D:
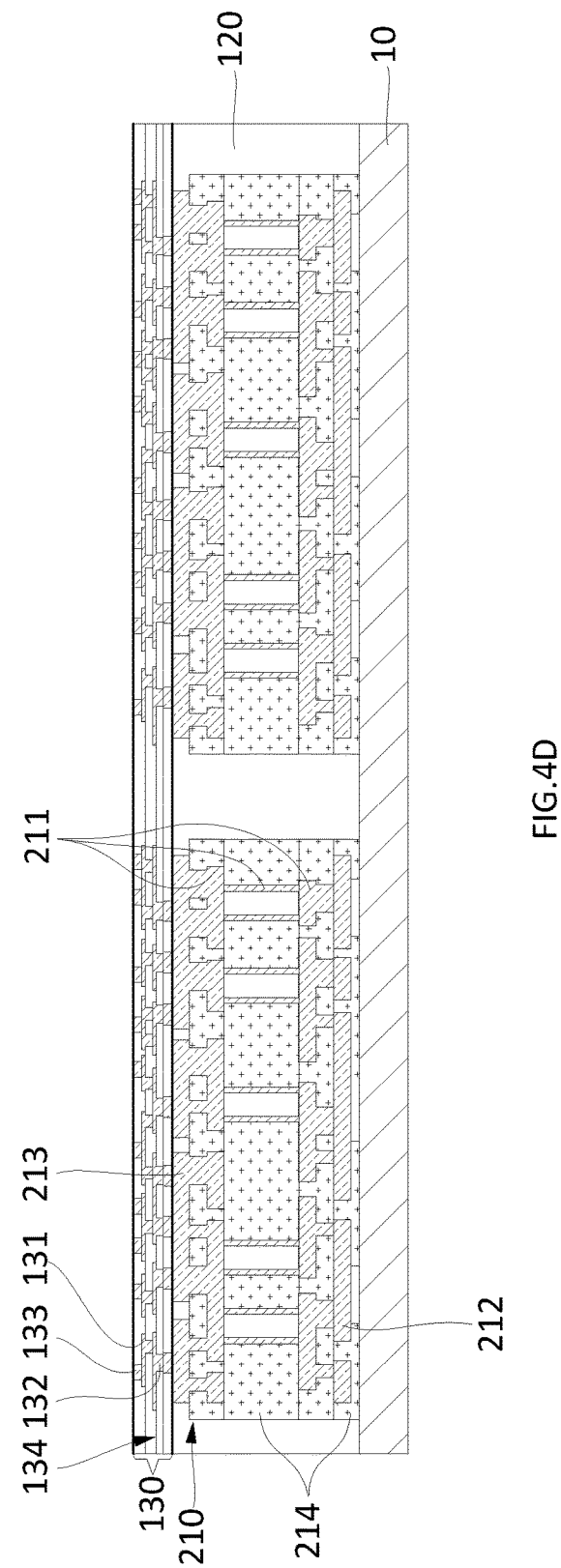

FIG. 4D shows a cross-sectional view of semiconductor device 200 at a later stage of manufacture. In some examples, the stage of FIG. 4D can correspond to or be similar to the stage described with respect to FIG. 2D. In the example shown in FIG. 4D, RDS substrate 130 can be provided on encapsulant 120 and base substrates 210. RDS substrate 130 can be formed on the entire top side of encapsulant 120 and multiple base substrates 210, in a process similar to that described above with respect to FIG. 2D. In some examples, RDS substrate 130 can comprise or be referred to as an RDL substrate, a buildup substrate, a coreless substrate, a fine-pitch substrate, or a high routing density substrate. RDS bottom terminals 132 can be provided on a bottom side of RDS substrate 130 and can be coupled to base conductive structure 211. In some examples, RDS bottom terminals 132 can be coupled with base top terminals 213 of base substrate 210 to electrically connect RDS substrate 130 to base substrate 210.

Figure 4E:
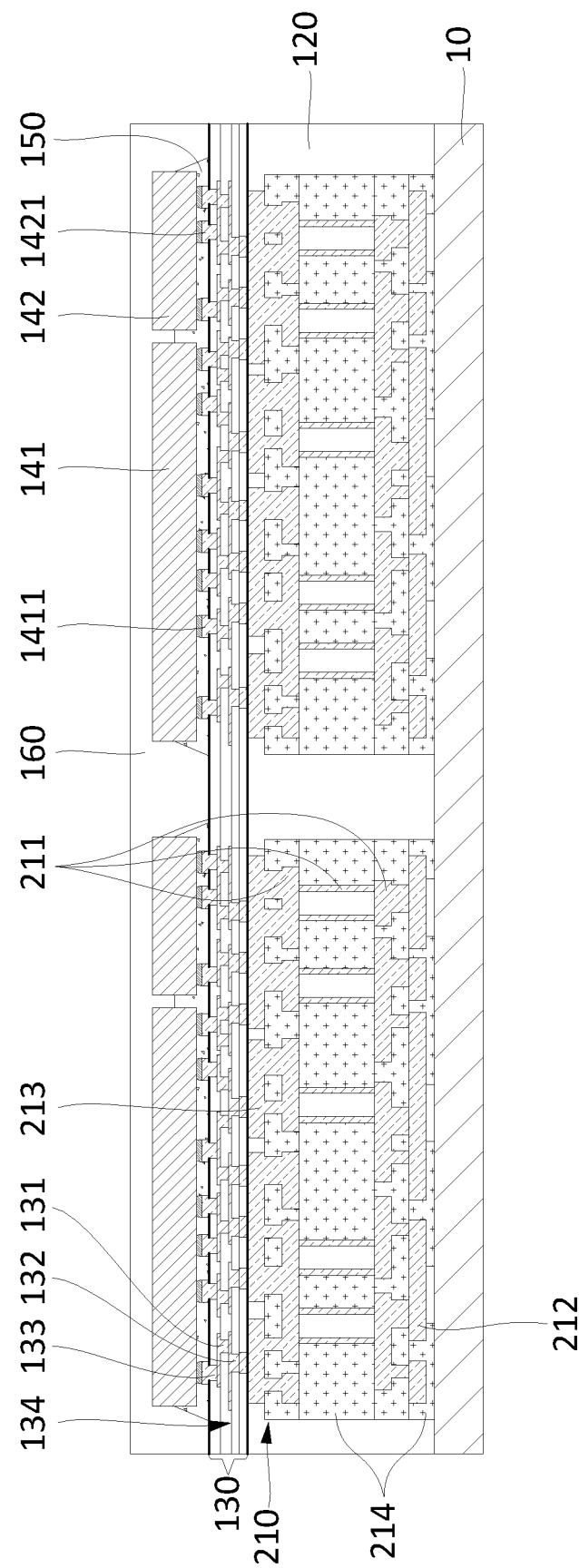

FIG. 4E shows a cross-sectional view of semiconductor device 200 at a later stage of manufacture. In some examples, the stage of FIG. 4E can correspond to or be similar to the stage described with respect to FIG. 2E. In the example shown in FIG. 4E, electronic components 141 and 142 can be attached onto RDS substrate 130. In some examples, a first electronic component 141 and a second electronic component 142 can be coupled to RDS top terminals 133 of RDS substrate 130. In some examples, first electronic component 141 and second electronic component 142 are separated from each other to be positioned on one single base substrate 210.

In the example shown in FIG. 4E, underfill 150 optionally can be positioned between electronic components 141 and 142 and RDS substrate 130. Underfill 150 can cover first component terminals 1411, second component terminals 1421 and RDS top terminals 133. In some examples, optionally, encapsulant 160 can encapsulate electronic components 141 and 142. In some examples, underfill 150 can be a molded underfill or can comprise a portion of the same layer as encapsulant 160.

Figure 4F:
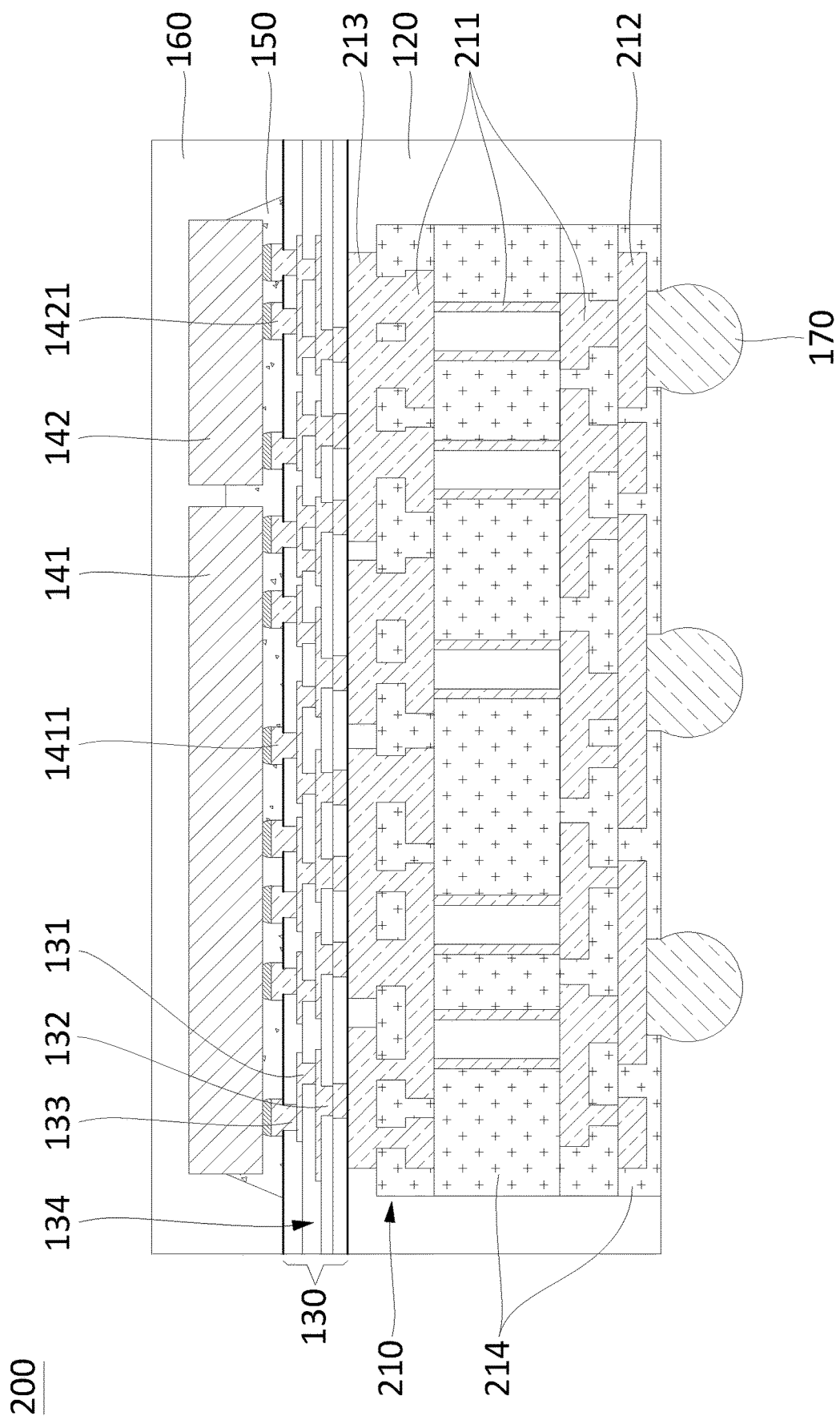

FIG. 4F shows a cross-sectional view of semiconductor device 200 at a later stage of manufacture. In some examples, the stage of FIG. 4F can correspond to or be similar to the stage described with respect to FIG. 2F. In the example shown in FIG. 4F, carrier 10 positioned under base substrate 210 can be removed or separated. In some examples, carrier 10 can be removed or separated from base substrate 210 by grinding, heating, a chemical material, UV rays, or a physical force. With carrier 10 removed, base bottom terminals 212 of base substrate 210 can be exposed.

In the example shown in FIG. 4F, external interconnects 170 can be connected to base bottom terminals 212, and encapsulants 120 and 160 and RDS substrate 130 can be together subjected to sawing or singulation to provide individual semiconductor devices 200. In some examples, encapsulants 120 and 160 and RDS substrate 130 can first be subjected to sawing or singulation, and external interconnects 170 can be connected to base bottom terminals 212 to provide individual semiconductor devices 200.

Figure 5:
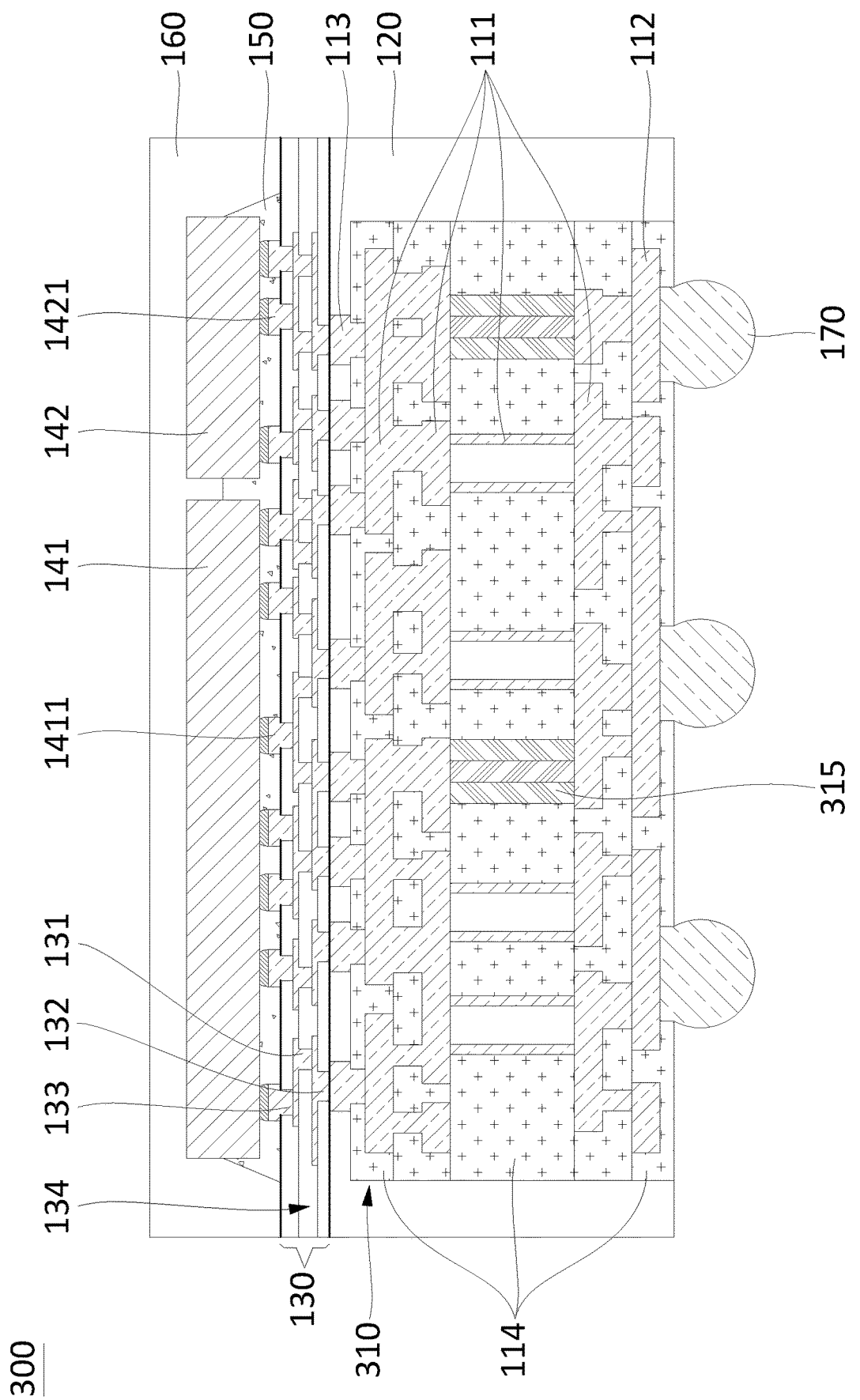
FIG. 5 shows a cross-sectional view of an example semiconductor device.

FIG. 5 shows a cross-sectional view of an example semiconductor device 300. In the example shown in FIG. 5, semiconductor device 300 can comprise base substrate 310, encapsulants 120 and 160, RDS substrate 130, electronic components 141 and 142, underfill 150 and external interconnects 170. In some examples, semiconductor device 300 can comprise corresponding elements, features, materials, or formation processes similar to those of other semiconductor device described in this disclosure, such as semiconductor device 100.

Base substrate 310 can comprise base conductive structure 111, base bottom terminals 112, base top terminals 113, base dielectric structure 114, and components 315. Embedded components 315 can be positioned within base substrate 310 and can be coupled to base conductive structure 111. Embedded component 315 can be protected from external environments by base dielectric structure 114. In some examples, embedded components 315 can comprise or be referred to as passive devices such as capacitors, or active devices such as transistors. In some examples, embedded components 315 can be similar to first electronic component 141 or second electronic component 142. In some examples, the thickness of embedded components 315 can range from about 70 µm to about 500 µm. In some examples, embedded components 315 can couple between base bottom terminals 112 and base top terminals 113.

Figure 6:
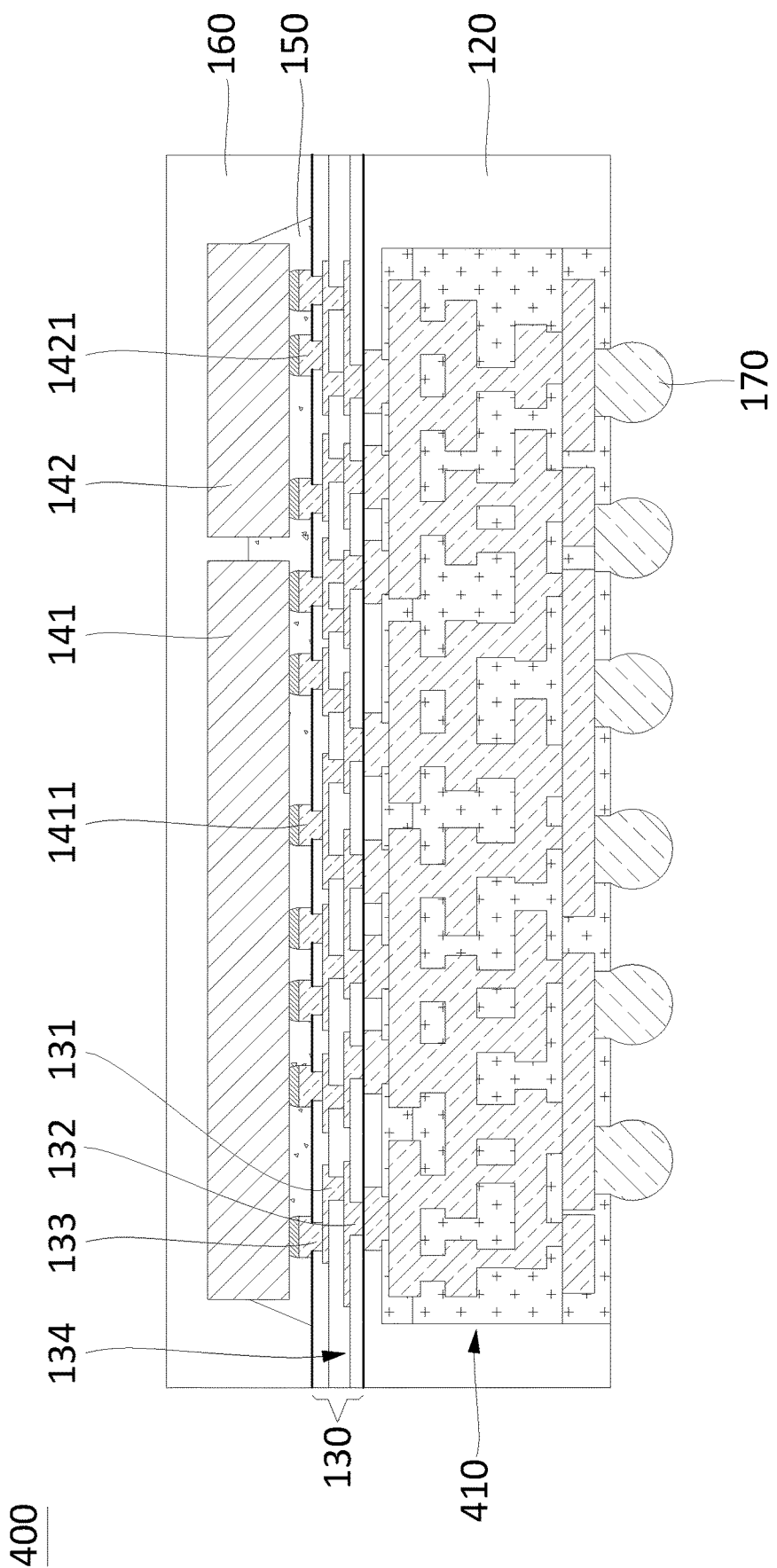
FIG. 6 shows a cross-sectional view of an example semiconductor device.

FIG. 6 shows a cross-sectional view of an example semiconductor device 400. In the example shown in FIG. 6, semiconductor device 400 can comprise base substrate 410, encapsulants 120 and 160, RDS substrate 130, electronic components 141 and 142, underfill 150 and external interconnects 170. In some examples, semiconductor device 400 can comprise corresponding elements, features, materials, or formation processes similar to those of other semiconductor device described in this disclosure, such as semiconductor device 100. Base substrate 410 can be similar to base substrate 110, and can be coreless. In some examples, base substrate 410 can comprise or be referred to as an RDL substrate, a buildup substrate, or a coreless substrate. In some examples, base substrate 410 can be similar to RDS substrate 130.

Figure 7:
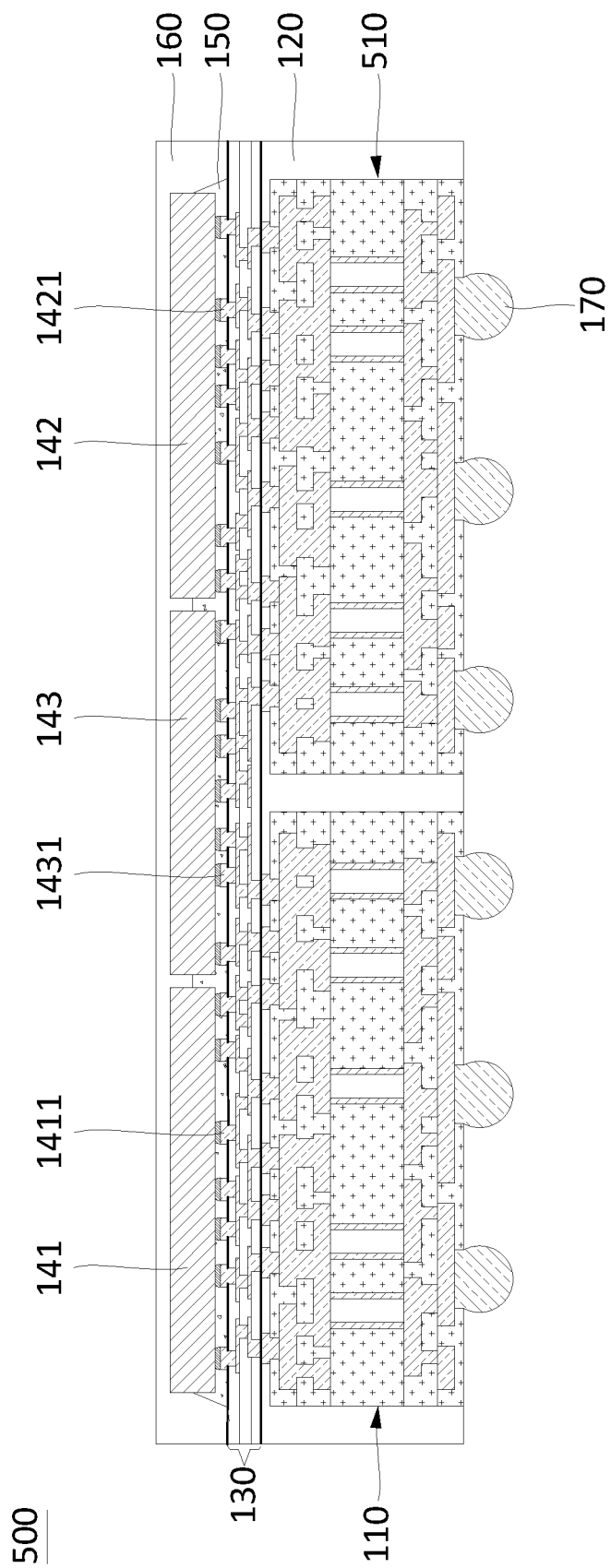
FIG. 7 shows a cross-sectional view of an example semiconductor device.

FIG. 7 shows a cross-sectional view of an example semiconductor device 500. In the example shown in FIG. 7, semiconductor device 500 can comprise first base substrate 110, second base substrate 510, encapsulant 120, encapsulant 160, RDS substrate 130, electronic components 141, 142, and 143, underfill 150, or external interconnects 170. In some examples, semiconductor device 500 can comprise corresponding elements, features, materials, or formation processes similar to those of other semiconductor device described in this disclosure, such as semiconductor device 100.

Electronic components 141, 142, and 143 can comprise first electronic component 141, second electronic component 142, and third electronic component 143. First electronic component 141 can comprise first component terminals 1411, second electronic component 142 can comprise second component terminals 1421, and third electronic component 143 can comprise third component terminals 1431.

First base substrate 110, second base substrate 510, encapsulants 120 and 160, RDS substrate 130, underfill 150, and external interconnects 170 can be referred to as a semiconductor package or a package, and can provide protection for electronic components 141, 142, and 143 from external elements or environmental exposure. The semiconductor package can provide electrical couplings between an external component and electronic components 141, 142, and 143.

Figure 8C:
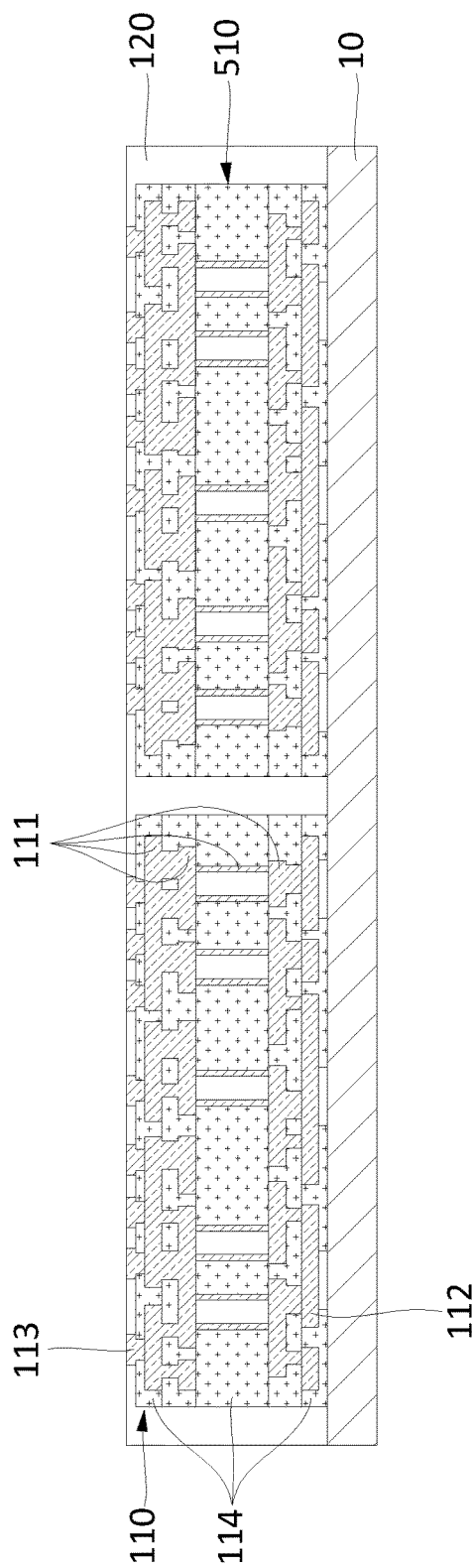

FIGS. 8A to 8F show cross-sectional views of an example method for manufacturing an example semiconductor device. FIG. 8A shows a cross-sectional view of semiconductor device 500 at an early stage of manufacture. In some examples, the stage of FIG. 8A can correspond to or be similar to the stage described with respect to FIG. 2A or FIG. 4A. In the example shown in FIG. 8A, first base substrate 110 and second base substrate 510 can be provided on a top side of carrier 10. Multiple first base substrates 110 and multiple second base substrates 510 can be alternately arranged on the top side of carrier 10. In some examples, second base substrate 510 can comprise or be referred to as a laminate substrate, a pre-formed substrate, or a coarse-pitch substrate. First base substrate 110 and second base substrate 510 can comprise respective base conductive structure 111, base bottom terminals 112, base top terminals 113, and base dielectric structure 114. In some examples, second base substrate 510 can comprise corresponding elements, features, materials, or formation processes similar to those of base substrate 110 previously described.

FIG. 8B shows a cross-sectional view of semiconductor device 500 at a later stage of manufacture. In some examples, the stage of FIG. 8B can correspond to or be similar to the stage described with respect to FIG. 2B or FIG. 4B. In the example shown in FIG. 8B, encapsulant 120 can encapsulate at once first base substrates 110 and second base substrates 510 above carrier 10. Encapsulant 120 can encapsulate lateral sides and top sides of first base substrates 110 and second base substrates 510. In some examples, encapsulant 120 can encapsulate base top terminals 113 exposed at the top sides of first base substrates 110 and second base substrates 510.

FIG. 8C shows a cross-sectional view of semiconductor device 500 at a later stage of manufacture. In some examples, the stage of FIG. 8C can correspond to or be similar to the stage described with respect to FIG. 2C or FIG. 4C. In the example shown in FIG. 8C, base top terminals 113 of first base substrates 110 and second base substrates 510 can be exposed by removing a top portion of encapsulant 120.

Figure 8D:
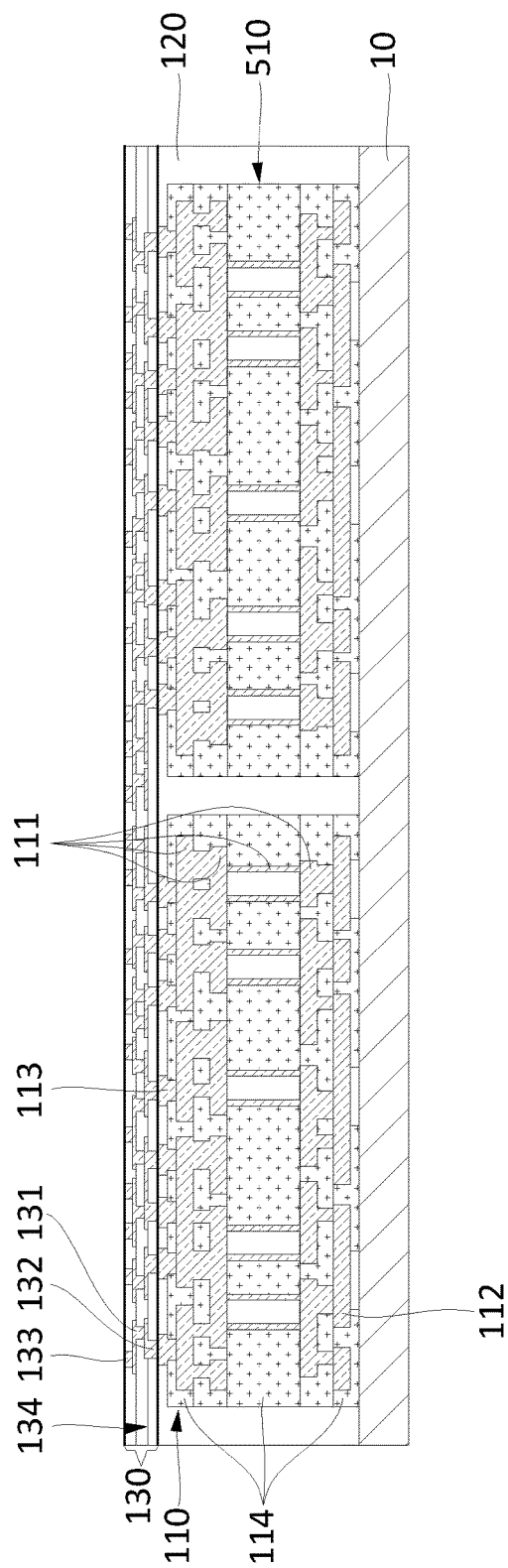

FIG. 8D shows a cross-sectional view of semiconductor device 500 at a later stage of manufacture. In some examples, the stage of FIG. 8D can correspond to or be similar to the stage described with respect to FIG. 2D or FIG. 4D. In the example shown in FIG. 8D, RDS substrate 130 can be provided on encapsulant 120. In some examples, RDS substrate 130 can be provided on the entire top side of encapsulant 120 encapsulating multiple first base substrates 110 and multiple second base substrates 510. RDS substrate 130 can couple first base substrates 110 to second base substrates 510. In some examples, RDS substrate 130 can comprise or be referred to as an RDL substrate, a buildup substrate, a coreless substrate, a fine-pitch substrate, or a high routing density substrate.

RDS conductive structure 131 can transfer or redistribute signals, currents, or voltages in RDS substrate 130. RDS bottom terminals 132 can be connected to base top terminals 113 of first base substrates 110 and base top terminals 113 of second base substrate 510 to couple first base substrate 110, second base substrate 510, and RDS substrate 130 to one another. RDS top terminals 133 can be provided on a top side of RDS substrate 130, and can provide electrical contacts between RDS conductive structure 131 and electronic components 141, 142 and 143. In some examples RDS top terminals 133 can be provided, over encapsulant 120, between first base substrate 110 and second base substrate 510.

Figure 8E:
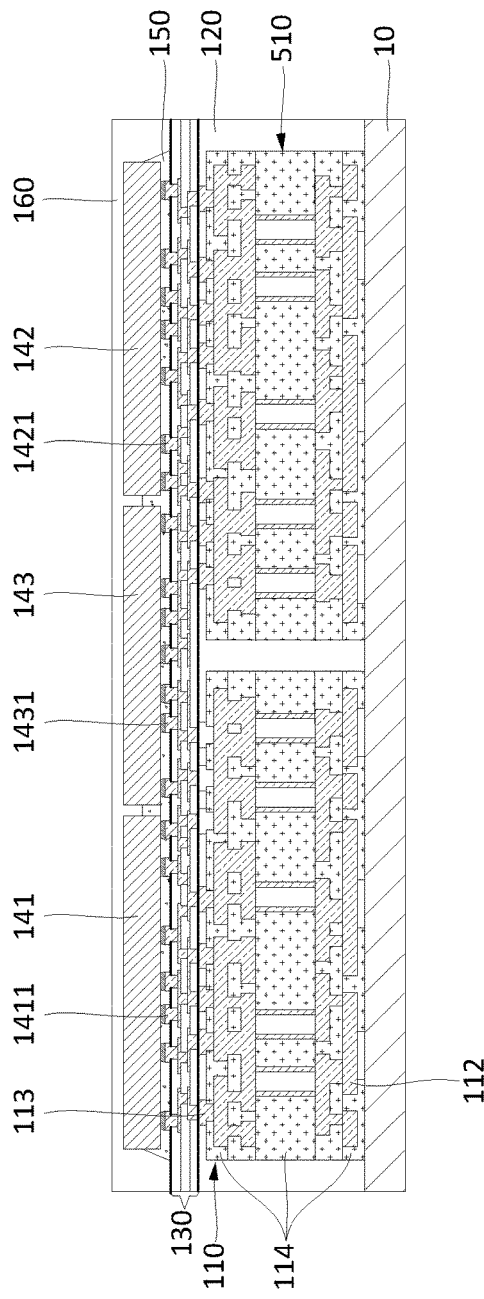

FIG. 8E shows a cross-sectional view of semiconductor device 500 at a later stage of manufacture. In some examples, the stage of FIG. 8E can correspond to or be similar to the stage described with respect to FIG. 2E or FIG. 4E. In the example shown in FIG. 8E, electronic components 141, 142, or 143 can be attached onto RDS substrate 130. In some examples, first electronic component 141, second electronic component 142, and third electronic component 143 can be coupled with RDS top terminals 133 of RDS substrate 130. First electronic component 141 can be positioned on RDS substrate 130 over first base substrate 110, and second electronic component 142 can be positioned on RDS substrate 130 over second base substrate 510. Third electronic component 143 can be positioned on RDS substrate 130 overlapping both first base substrate 110 and second base substrate 510.

Third electronic component 143 can comprise or be referred to as a semiconductor die, a semiconductor chip, or a semiconductor package such as a chip scale package. Third electronic component 143 can comprise a semiconductor material, for example silicon (Si). Third electronic component 143 can comprise passive devices or active devices such as transistors. In some examples, third electronic component 143 can comprise corresponding elements, features, materials, or formation processes similar to those of first electronic component 141 previously described. Third electronic component 143 can comprise third component terminals 1431. Third component terminals 1431 can be provided on a bottom side of third electronic component 143. Third component terminals 1431 can be coupled to RDS top terminals 133 positioned on the portion between first base substrate 110 and second base substrate 510. In some examples, third component terminals 1431 can comprise corresponding elements, features, materials, or formation processes similar to those of first component terminals 1411 previously described.

In the example shown in FIG. 8E, underfill 150 optionally can be provided between electronic components 141, 142, or 143 and RDS substrate 130. Underfill 150 can cover first component terminals 1411, second component terminals 1421, third component terminals 1431, and RDS top terminals 133. In some examples, encapsulant 160 optionally can encapsulate electronic components 141, 142, or 143. In some examples, underfill 150 can be a molded underfill or can comprise a portion of the same layer as encapsulant 160. In some examples, electronic component 143 can be over both first base substrate 110 and second base substrate 510.

Figure 8F:
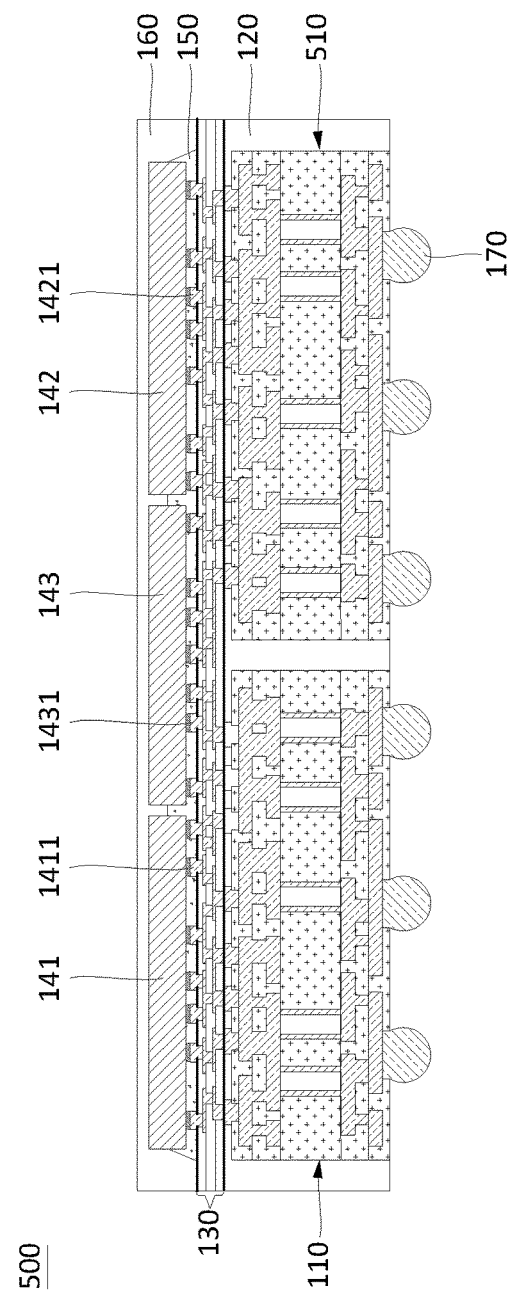

FIG. 8F shows a cross-sectional view of semiconductor device 500 at a later stage of manufacture. In some examples, the stage of FIG. 8F can correspond to or be similar to the stage described with respect to FIG. 2F or FIG. 4F. In the example shown in FIG. 8F, carrier 10 positioned under first base substrate 110 and second base substrate 510 can be removed or separated. With carrier 10 removed, base bottom terminals 112 of first base substrate 110 and second base substrate 510 can be exposed.

In the example shown in FIG. 8F, external interconnects 170 can be connected to exposed base bottom terminals 112, and encapsulants 120 and 160 and RDS substrate 130 can be together subjected to sawing or singulation to provide individual semiconductor devices 500. In some examples, the sawing can be performed such that one single semiconductor device 500 comprises first base substrate 110, second base substrate 510, and electronic components 141, 142, and 143. In some examples, encapsulants 120 and 160 and RDS substrate 130 can first be subjected to sawing or singulation, and external interconnects 170 can be connected to base bottom terminals 112 to provide individual semiconductor devices 500.

Figure 9:
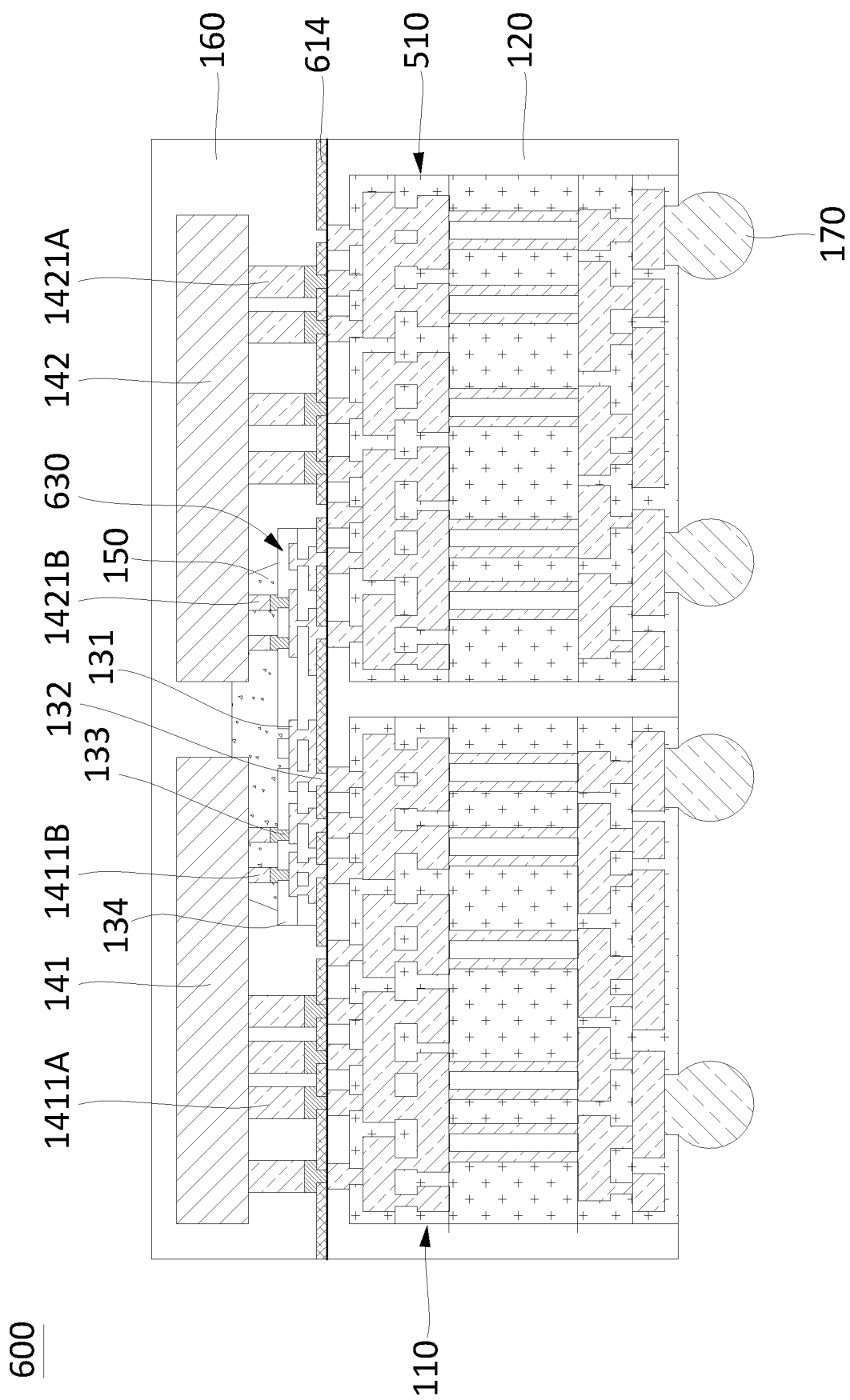
FIG. 9 shows a cross-sectional view of an example semiconductor device.

FIG. 9 shows a cross-sectional view of an example semiconductor device 600. In the example shown in FIG. 9, semiconductor device 600 can comprise first base substrate 110, second base substrate 510, encapsulant 120, encapsulant 160, RDS substrate 630, electronic components 141 and 142, underfill 150, and external interconnects 170. In some examples, semiconductor device 600 can comprise corresponding elements, features, materials, or formation processes similar to those of other semiconductor device described in this disclosure, such as semiconductor device 100. In some examples, RDS substrate 630 and related structures herein shown in FIGS. 9-12 can be similar to the structures of the semiconductor devices shown in U.S. Pat. No. 10,497,674 B2 which is hereby incorporated herein in its entirety.

RDS substrate 630 can comprise RDS conductive structure 131, RDS bottom terminal 132, RDS top terminals 133, and RDS dielectric structure 134. First electronic component 141 can comprise first component terminals 1411A and 1411B, and second electronic component 142 can comprise second component terminals 1421A and 1421B. In some examples, encapsulant 120 can contact a lateral side of base substrate 110 or base substrate 510. RDS substrate 630 can be over base substrate 110 or base substrate 510, and RDS substrate 630 can comprise an RDS conductive structure 131.

RDS substrate 630 can be similar to other RDS substrate described in this disclosure, such as RDS substrate 110. For example, RDS substrate 630 can provide a finer pitch or higher routing density than first base substrate 110 or second base substrate 510. In the present example, RDS substrate 630 does not cover the entire top sides of encapsulant 120, of first base substrate 110, or of second base substrate 510. In some examples, a bottom side of RDS substrate 630 does not have any RDS bottom terminals facing base substrate 110. RDS substrate 630 can extend between and under portions of electronic components 141 or 142 to provide a fine pitch connection bridge or patch for dense routing of signals between them. RDS substrate 630 can also leave portions over first base substrate 110 and over second base substrate 510 uncovered such that electronic components 141 and 142 can respectively couple with first base substrate 110 and second base substrate 510 without passing through RDS substrate 630. In some examples, semiconductor device 600 can also comprise previously described RDS substrate 130 over base substrate 110, base substrate 510, and encapsulant 120, such that RDS substrate 630, electronic component 141, or electronic component 1424 can be positioned over RDS substrate 130. In some examples, base substrate 510 can be laterally adjacent to base substrate 110, and base substrate 510 can comprise its own conductive structure and dielectric structure similar to base conductive structure 111 and base dielectric structure 114 of base substrate 110.

In some examples, electronic component 141 can be over RDS substrate 630 and can be over component terminals 1411B coupled with RDS conductive structure 630. In some examples, electronic component 142 can be over RDS substrate 630 and can be over component terminals 1421B coupled with RDS conductive structure 630. In some examples, encapsulant 160 can contact a lateral side of electronic component 141 and a lateral side of electronic component 142.

First base substrate 110, second base substrate 510, encapsulants 120 and 160, RDS substrate 630, underfill 150 and external interconnects 170 can be referred to as a semiconductor package or a package and can provide protection for electronic components 141 and 142 from external elements or environmental exposure. The semiconductor package can provide electrical couplings between an external component and electronic components 141 and 142. In some examples, base substrate 510 can be laterally adjacent to base substrate 110, encapsulant 120 can contact a lateral side of base substrate 510, and electronic component 142 can be over base substrate 510. In some examples, base substrate 110 comprises a base conductive structure 111 coupled with component terminals 1411A, and base substrate 510 comprises a base conductive structure 111 coupled with component terminals 1421A. The base conductive structure 111 of base substrate 110 and the base conductive structure of base substrate 510 can couple with RDS conductive structure 131 of RDS substrate 630.

Figure 10A:
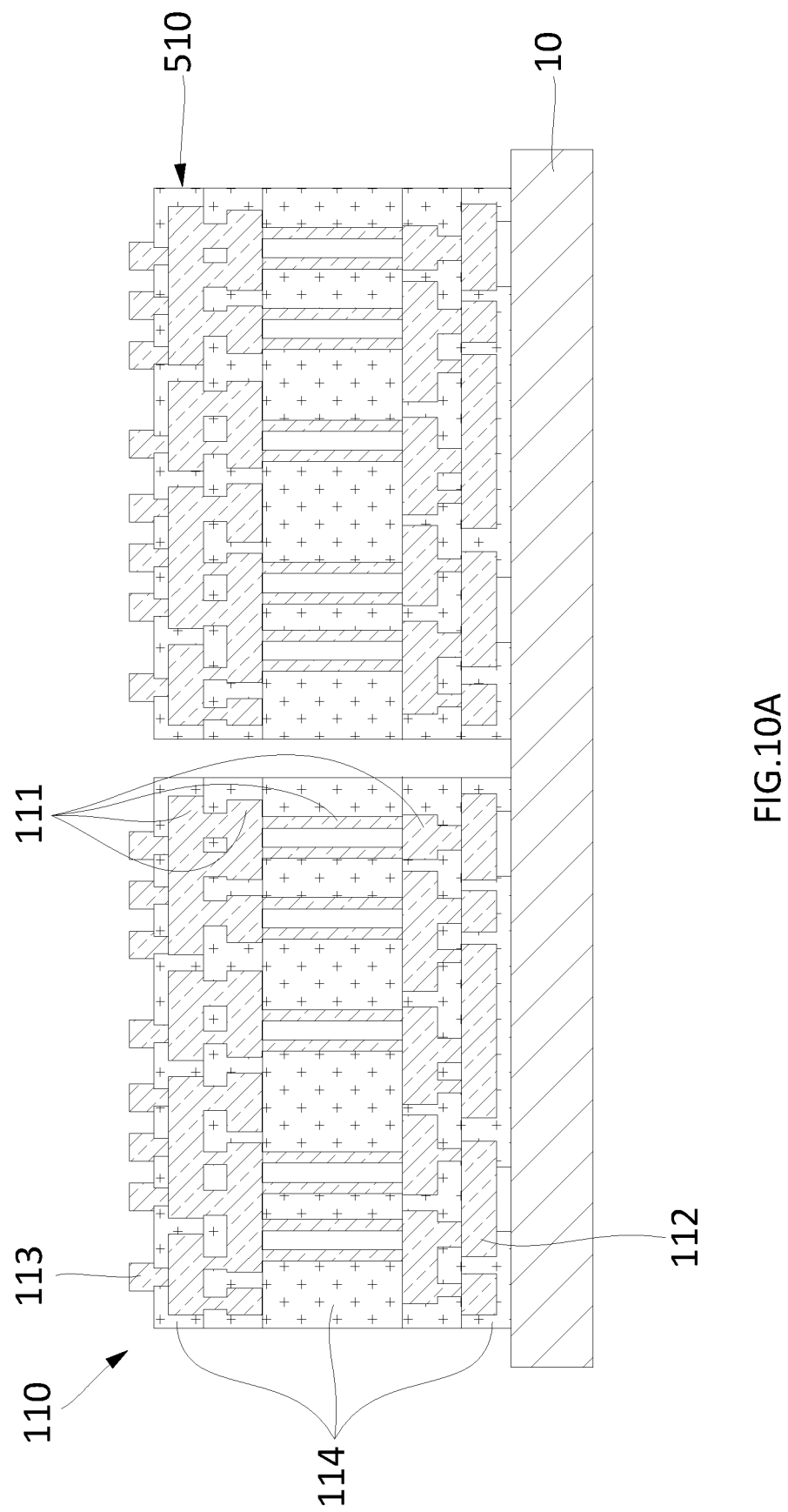
FIGS. 10A to 10F show cross-sectional views of an example method for manufacturing an example semiconductor device.

FIGS. 10A to 10F show cross-sectional views of an example method for manufacturing an example semiconductor device. FIG. 10A shows a cross-sectional view of semiconductor device 600 at an early stage of manufacture. In some examples, the stage of FIG. 10A can correspond to or be similar to the stage described with respect to FIG. 2A, FIG. 4A, or FIG. 8A. In the example shown in FIG. 10A, first base substrate 110 and second base substrate 510 can be provided on a top side of carrier 10. Multiple first base substrates 110 and multiple second base substrates 510 can be alternately arranged on the top side of carrier 10.

Figure 10B:
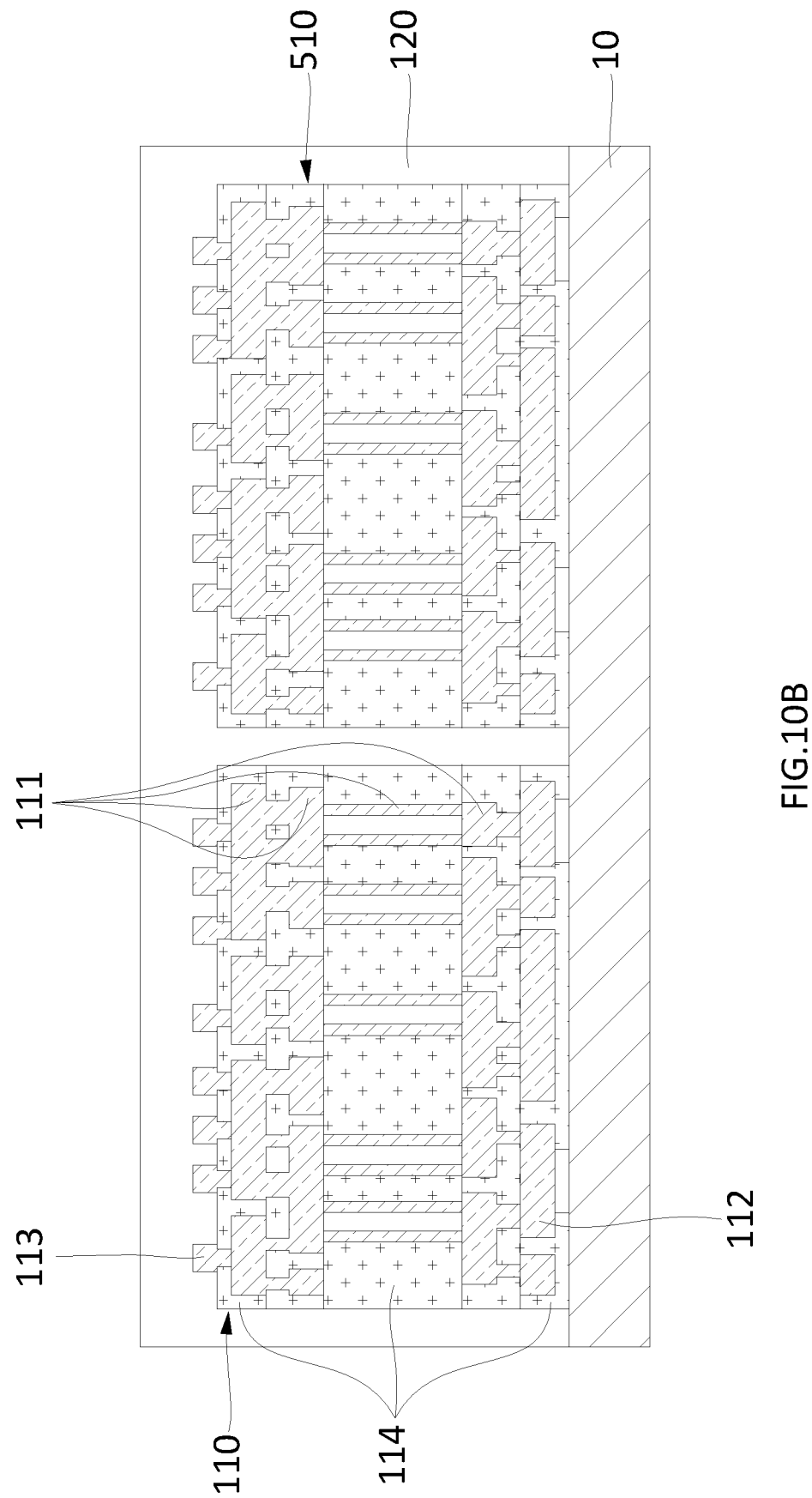

FIG. 10B shows a cross-sectional view of semiconductor device 600 at a later stage of manufacture. In some examples, the stage of FIG. 10B can correspond to or be similar to the stage described with respect to FIG. 2B, FIG. 4B, or FIG. 8B. In the example shown in FIG. 10B, encapsulant 120 can encapsulate multiple first base substrates 110 and multiple second base substrates 510 on carrier 10 at once. Encapsulant 120 can encapsulate lateral sides and top sides of multiple first base substrates 110 and multiple second base substrates 510. In some examples, encapsulant 120 can encapsulate base top terminals 113 exposed at top sides of first base substrate 110 and second base substrate 510.

Figure 10C:
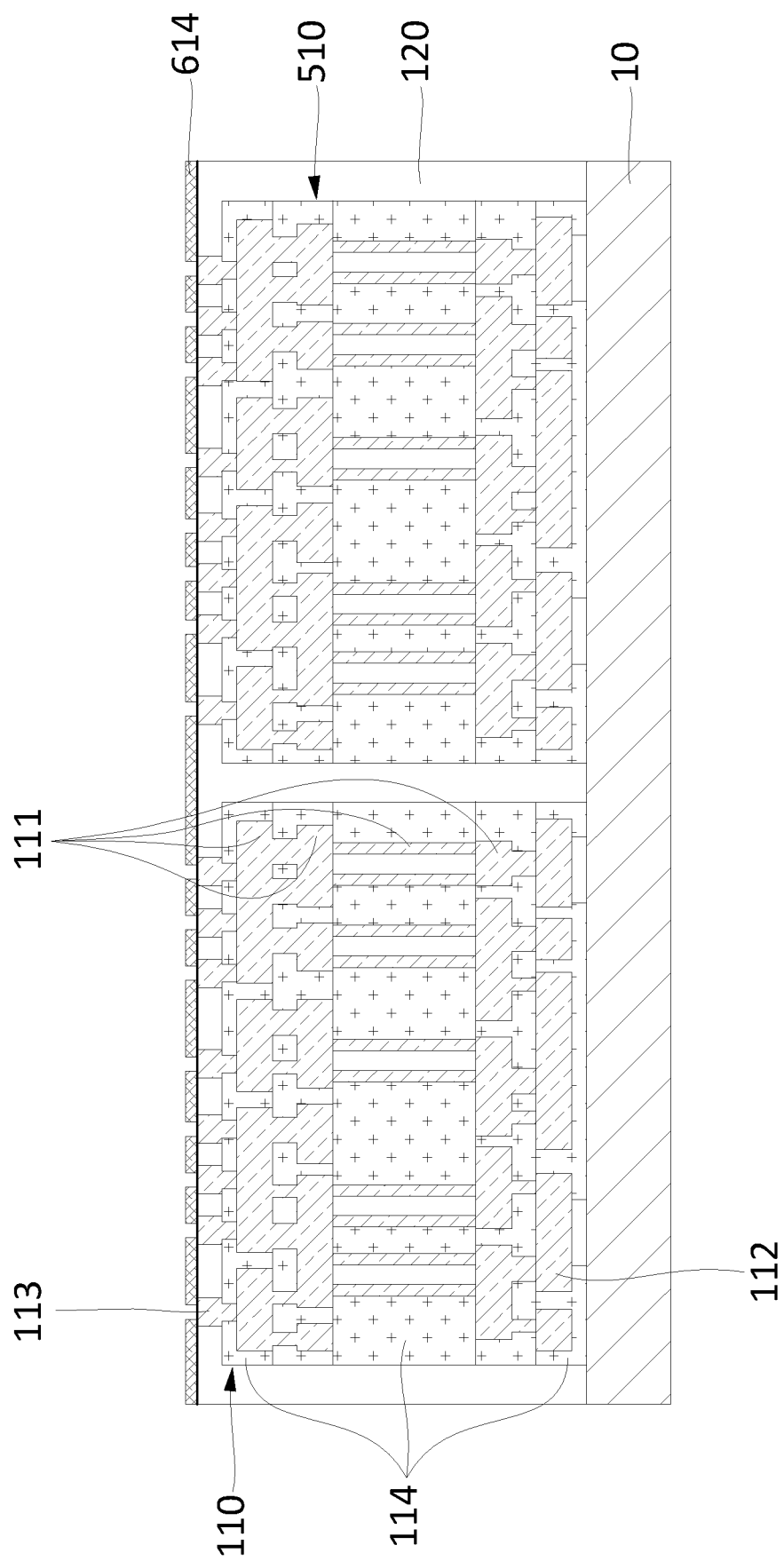

FIG. 10C shows a cross-sectional view of semiconductor device 600 at a later stage of manufacture. In some examples, the stage of FIG. 10C can correspond to or be similar to the stage described with respect to FIG. 2C, FIG. 4C, or FIG. 8C. In the example shown in FIG. 10C, base top terminals 113 of first base substrate 110 and second base substrate 510 can be exposed by removing a top portion of encapsulant 120. Dielectric layer 614 can also be provided over encapsulant 120, with openings to expose base top terminals 113. In some examples, dielectric layer 614 can comprise or be referred as a solder mask.

Figure 10D:
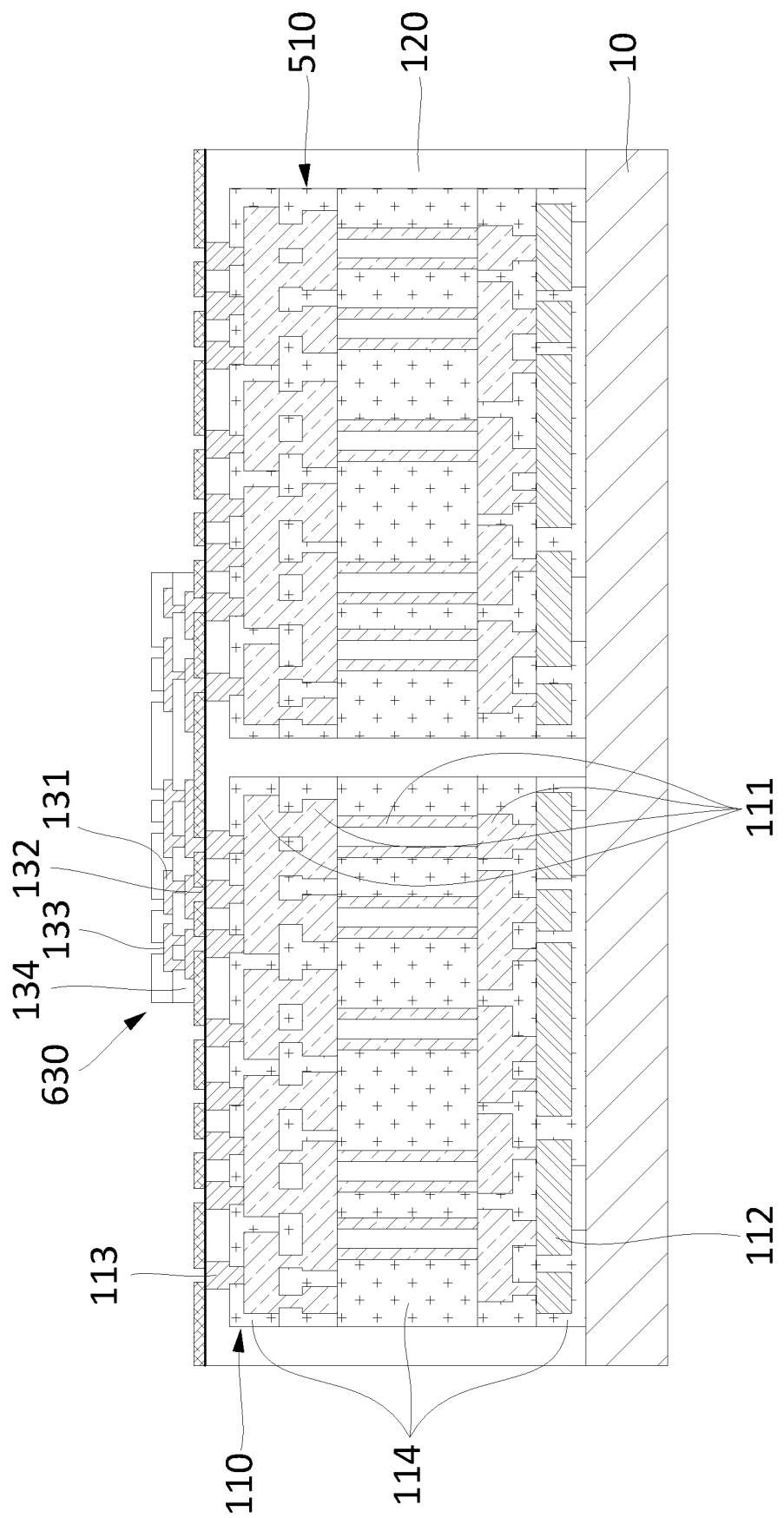

FIG. 10D shows a cross-sectional view of semiconductor device 600 at a later stage of manufacture. In some examples, the stage of FIG. 10D can correspond to or be similar to the stage described with respect to FIG. 2D, FIG. 4D, or FIG. 8D. In the example shown in FIG. 10D, RDS substrate 630 can be provided on encapsulant 120. In some examples, RDS substrate 630 can be provided over portions of first base substrate 110 or second base substrate 510, without completely covering first base substrate 110, second base substrate 510, or encapsulant 120. RDS substrate 630 can be provided to extend from a portion over first base substrate 110 to a portion over second base substrate 510.

In some examples, RDS substrate 630 can comprise corresponding elements, features, materials, or formation processes similar to those of RDS substrate 130 previously described. In some examples, RDS substrate 630 can be formed or built over first base substrate 110, second base substrate 510, or encapsulant 120. In some examples, RDS substrate 630 can be pre-formed and then attached over first base substrate 110, second base substrate 510, or encapsulant 120. In some examples, RDS substrate 630 can comprise or be referred to as an RDL substrate, a buildup substrate, a coreless substrate, a fine-pitch substrate, a high routing density substrate, a connect-die, a connect-chip, or a connect-patch.

RDS conductive structure 131 can transfer or redistribute signals, currents or voltages in RDS substrate 630. RDS top terminals 133 can be provided on a top side of RDS substrate 630, and can provide electrical contacts between RDS conductive structure 131 and electronic components 141 and 142. In some examples, RDS substrate 630 can be coupled through RDS bottom terminals 132 to first base substrate 110 or second base substrate 510. In some examples, RDS substrate 630 can lack electrical connection from the bottom side of RDS substrate 630 to first base substrate 110 or second base substrate 510. In some examples, RDS substrate 630 can couple with first base substrate 110 through first component terminals 1411A and 1411B of first electronic component 141. In some examples, RDS substrate 630 can couple with second base substrate 510 through second component terminals 1421A and 1421B of second electronic component 142. In some examples, dielectric layer 614 positioned beneath the bottom side of RDS substrate 630 can electrically isolate it from first base substrate 110 or second base substrate 510.

In some examples, the bottom side of RDS substrate 630 can comprise a foundation layer fully covering the bottom footprint of RDS substrate 630 from first base substrate 110, second base substrate 510, or encapsulant 120. Such a foundation layer can comprise a dielectric such as glass, or a semiconductor such as silicon. In some examples, such a foundation layer can comprise a portion of a carrier on which RDS substrate 630 was formed.

Figure 10E:
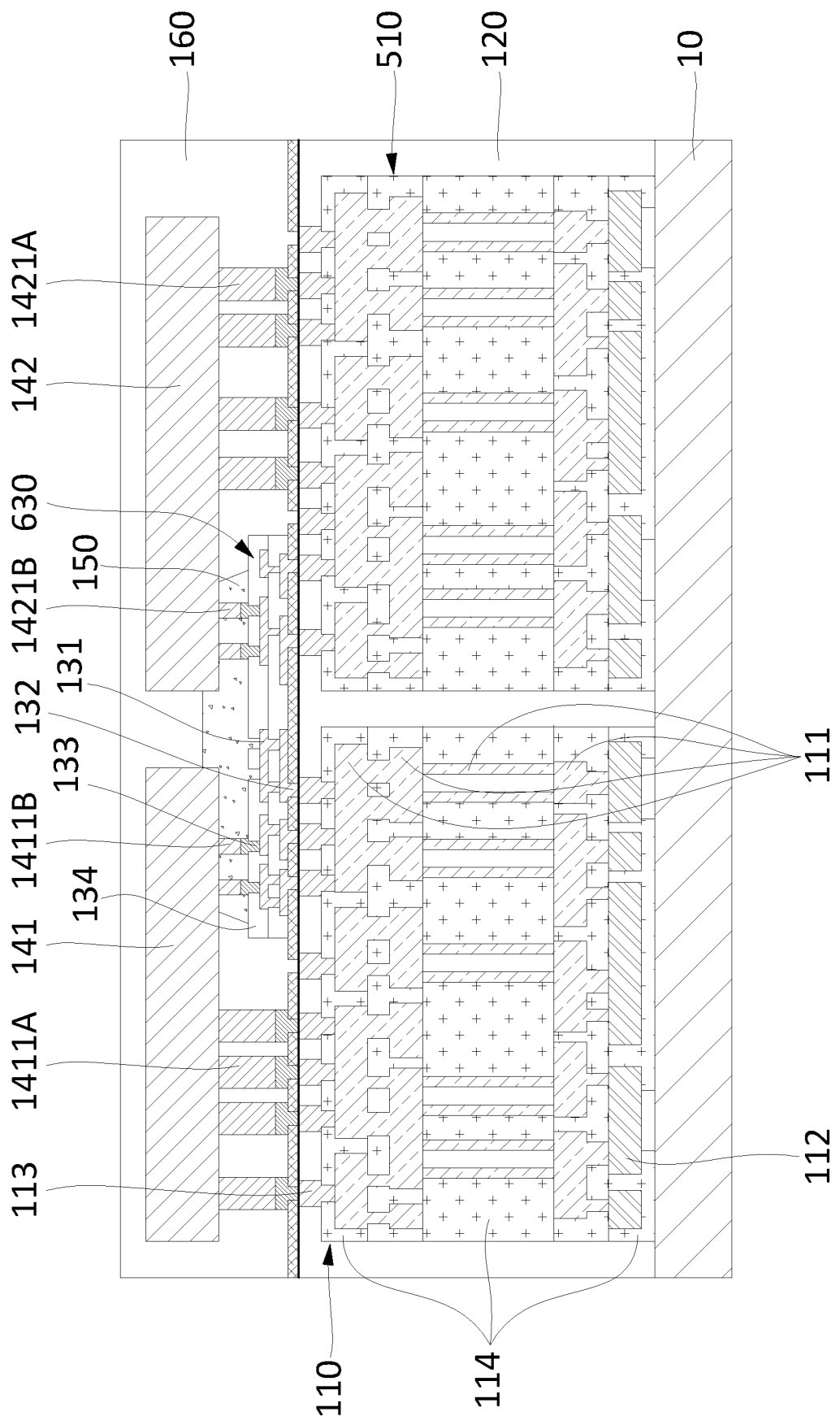

FIG. 10E shows a cross-sectional view of semiconductor device 600 at a later stage of manufacture. In some examples, the stage of FIG. 10E can correspond to or be similar to the stage described with respect to FIG. 2E, FIG. 4E, or FIG. 8E. In the example shown in FIG. 10E, electronic components 141 and 142 can be attached onto RDS substrate 630 and encapsulant 120.

A portion of first electronic component 141 can be coupled to RDS substrate 630, and another portion of first electronic component 141 can be coupled to first base substrate 110 without electrically passing through RDS substrate 630. First component terminals 1411A of first electronic component 141 can be coupled to base top terminals 113 of first base substrate 110, and first component terminals 1411B of first electronic component 141 can be coupled to RDS top terminals 133 of RDS substrate 630. In some examples, RDS substrate 630 only partially overlaps a footprint of electronic component 141 or a footprint of electronic component 142. In some examples, electronic component 141 is over component terminals 1411B that are coupled with RDS conductive structure 131, and electronic component is over component terminals 1411A that are coupled with base conductive structure 111 of base substrate 110. In some examples, as discussed further below, component terminals 1411A can be spaced at a pitch greater than a pitch that components terminals 1411B are spaced.

A portion of second electronic component 142 can be coupled to RDS substrate 630, and another portion of second electronic component 142 can be coupled to second base substrate 510 without electrically passing through RDS substrate 630. Second component terminals 1421A of second electronic component 142 can be coupled to base top terminals 113 of second base substrate 510, and first component terminals 1421B of second electronic component 142 can be coupled to RDS top terminals 133 of RDS substrate 630.

First component terminals 1411A, first component terminals 1411B, second component terminals 1421A, or second component terminals 1421B can comprise conductive pillars, posts, or bumps. Relative to each other, first component terminals 1411A and second component terminals 1421A can have a coarser pitch, a thicker width, or a taller height, while first component terminals 1411B and second component terminals 1421B can have a finer pitch, a narrower width, or a shorter height In some examples, the pitch of first component terminals 1411A or of second component terminals 1421A can range from about 5.0 μm to about 100 μm. In some examples, the pitch of first component terminals 1411B or of second component terminals 1421B can range from about 5.0 μm to about 100 μm.

In some examples, the width of first component terminals 1411A or of second component terminals 1421A can range from about 2.0 μm to about 50 μm. In some examples, the width of first component terminals 1411B or of second component terminals 1421B can range from about 2.0 μm to about 50 μm.

In some examples, the height of first component terminals 1411A or of second component terminals 1421A can range from about 100 μm to about 250 μm. In some examples, the height of first component terminals 1411B or of second component terminals 1421B can range from about 40 μm to about 100 μm.

In the example shown in FIG. 10E, underfill 150 optionally can be provided between electronic components 141 and 142 and RDS substrate 630. In some examples, underfill 150 can extend to cover first component terminals 1411B, second component terminals 1421B, and RDS top terminals 133. In some examples underfill 150 can extend between first electronic component 141 and each of first base substrate 110 and RDS substrate 630, and between second electronic component 142 and each of second base substrate 510 and RDS substrate 630. In some examples, underfill 150 can cover first component terminals 1411A, base top terminals 113 of first base substrate 110, second component terminals 1421A, and base top terminals 113 of second base substrate 510. In some examples, encapsulant 160 optionally can encapsulate electronic components 141 and 142.

Figure 10F:
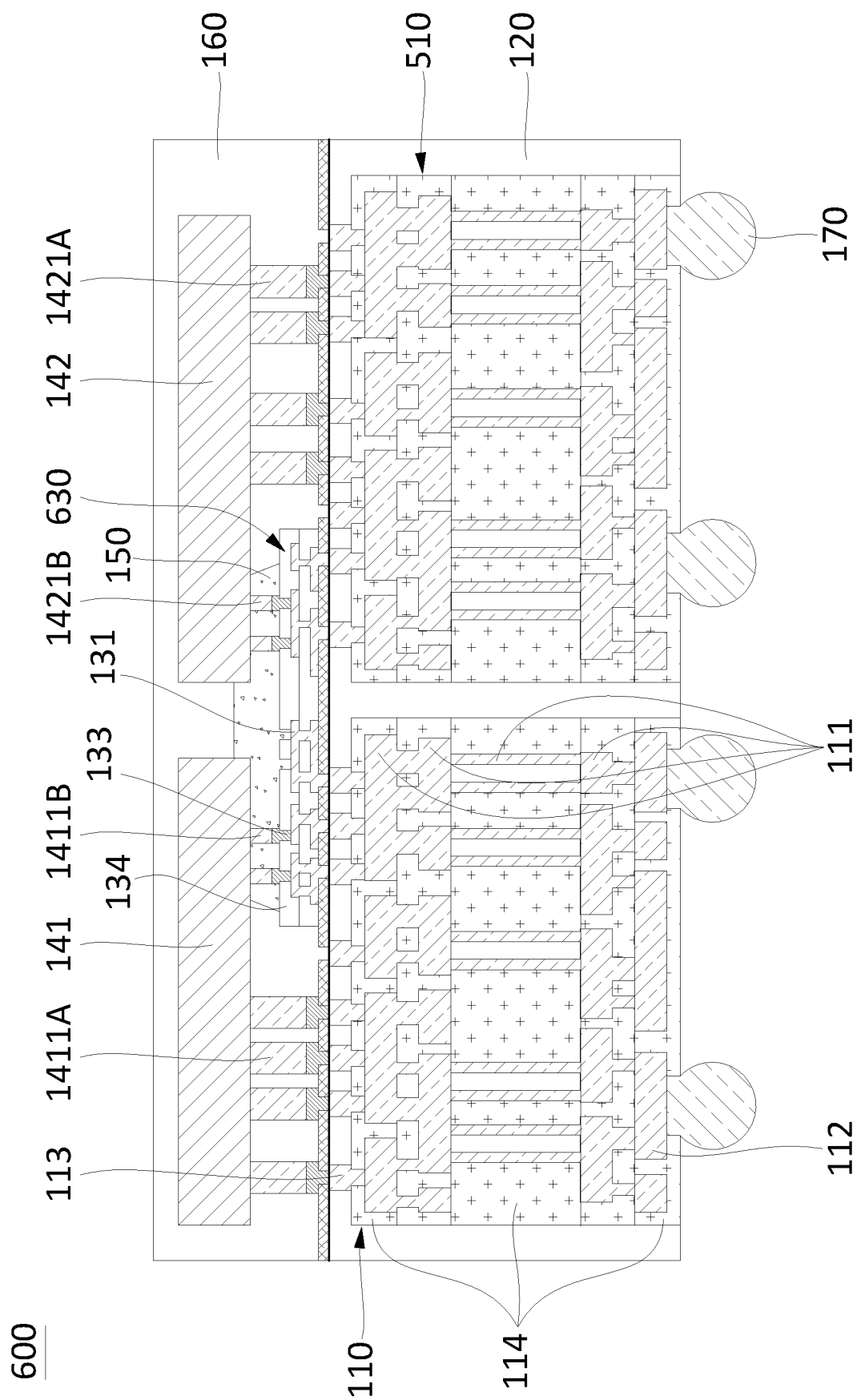

FIG. 10F shows a cross-sectional view of semiconductor device 600 at a later stage of manufacture. In some examples, the stage of FIG. 10F can correspond to or be similar to the stage described with respect to FIG. 2F, FIG. 4F, or FIG. 8F. In the example shown in FIG. 10F, carrier 10 positioned under first base substrate 110 and second base substrate 510 can be removed or separated. And base bottom terminals 112 of first base substrate 110 and second base substrate 510 can be exposed.

In the example shown in FIG. 10F, external interconnects 170 can be connected to exposed base bottom terminals 112, and encapsulants 120 and 160 can be subjected to sawing or singulation to provide individual semiconductor devices 600. In some examples, the sawing can be performed such that one single semiconductor device 600 comprises first base substrate 110, second base substrate 510, and RDS substrate 630. In some examples, encapsulants 120 and 160 can first be subjected to sawing or singulation, and external interconnects 170 can be connected to base bottom terminals 112, to provide individual semiconductor devices 600.

Figure 11:
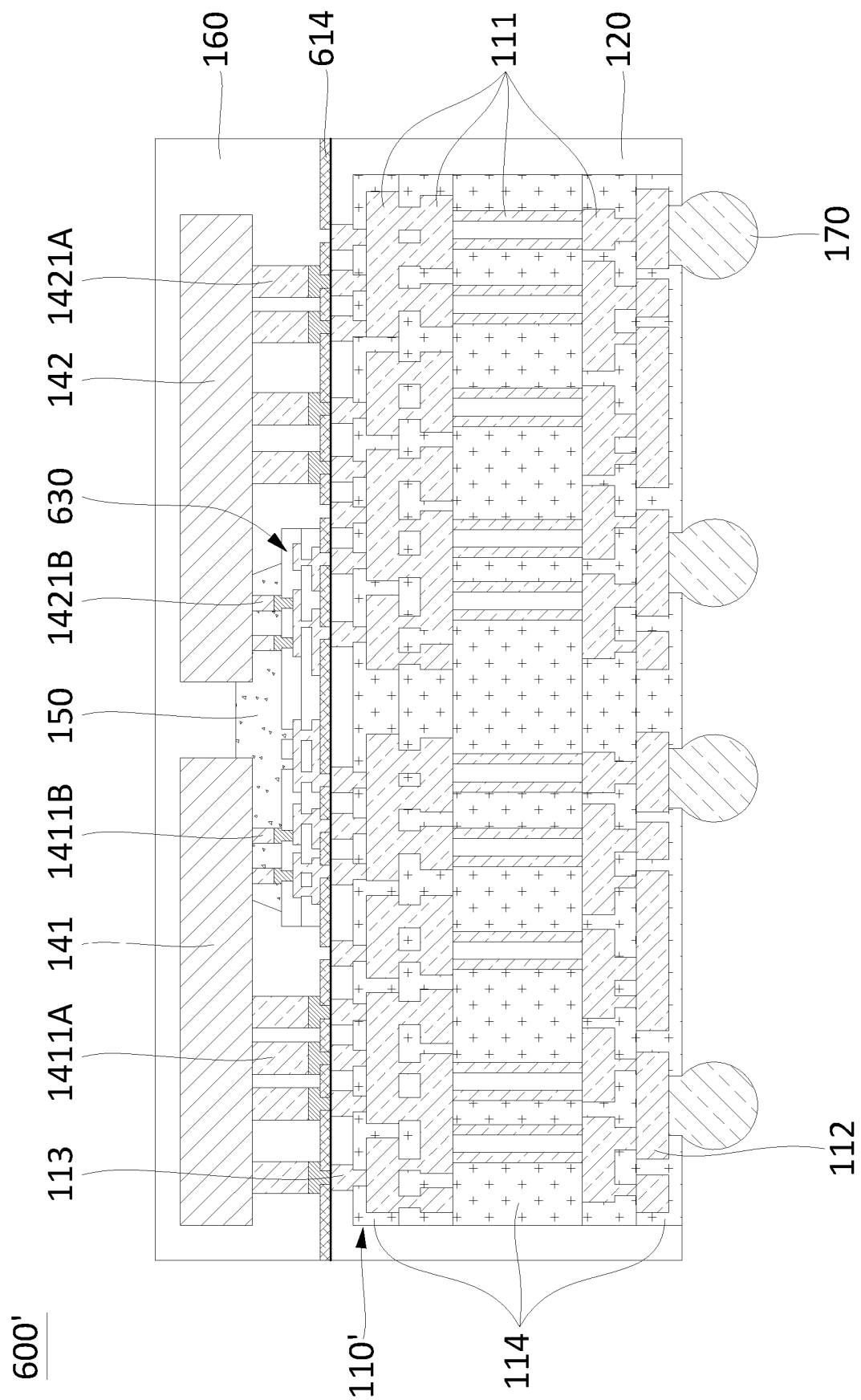
FIG. 11 shows a cross-sectional view of an example semiconductor device.

FIG. 11 shows a cross-sectional view of an example semiconductor device 600'. In the example shown in FIG. 11, semiconductor device 600' can comprise base substrate 110', encapsulants 120 and 160, RDS substrate 630, electronic components 141 and 142, underfill 150, and external interconnects 170. In some examples, semiconductor device 600' can comprise corresponding elements, features, materials, or formation processes similar to those of other semiconductor device described in this disclosure, such as semiconductor device 100 or 500.

Semiconductor device 600' can comprise a single base substrate 110' instead of two base substrates 110 and 510 shown for device 600 in FIG. 9. In some examples, base substrate can be similar to other substrates described in this disclosure, such as base substrate 110, 210, 310, 410. RDS substrate 630 can couple between base substrate 110' and electronic components 141 and 142. RDS substrate 630 can be provided on a top portion of base substrate 110'. In some examples, RDS substrate 630 can be located on a center of base substrate 110.

Figure 12:
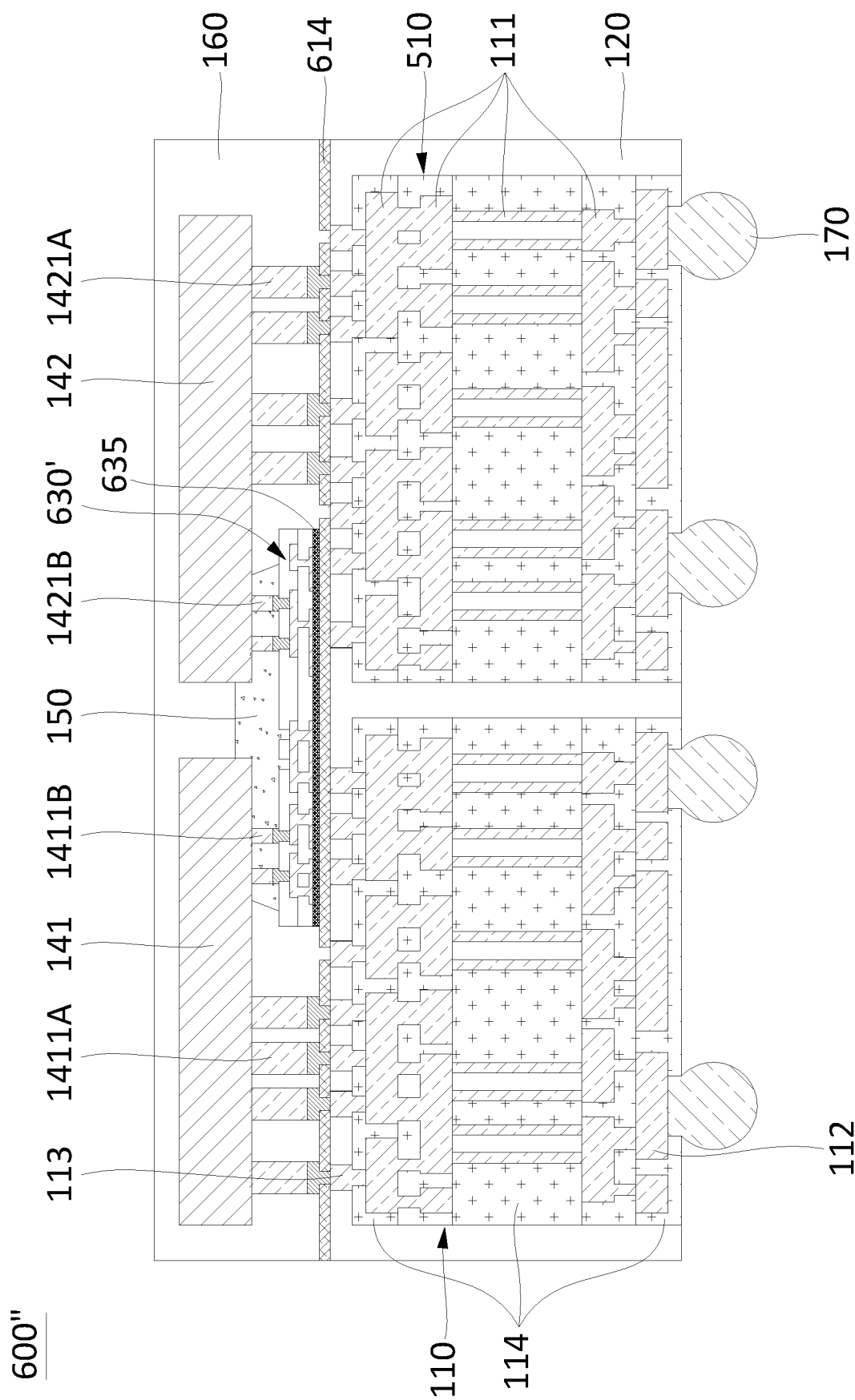
FIG. 12 shows a cross-sectional view of an example semiconductor device.

FIG. 12 shows a cross-sectional view of an example semiconductor device 600''. In the example shown in FIG. 12, semiconductor device 600'' can comprise base substrate 110, encapsulants 120 and 160, RDS substrate 630', electronic components 141 and 142, underfill 150 and external interconnects 170. In some examples, semiconductor device 600' can comprise corresponding elements, features, materials, or formation processes similar to those of other semiconductor device described in this disclosure, such as semiconductor device 100 or 500.

RDS substrate 630' can comprise corresponding elements, features, materials, or formation processes similar to those of RDS substrate 630 previously described. In some examples, RDS substrate 630' can be formed or built over first base substrate 110, second base substrate 510, or encapsulant 120. In some examples, RDS substrate 630' can be pre-formed and then attached over first base substrate 110, second base substrate 510, or encapsulant 120. In some examples, RDS substrate 630' can comprise or be referred to as an RDL substrate, a buildup substrate, a coreless substrate, a fine-pitch substrate, a high routing density substrate, a connect-die, a connect-chip, or a connect-patch.

RDS conductive structure 131 can transfer or redistribute signals, currents or voltages in RDS substrate 630. RDS top terminals 133 can be provided on a top side of RDS substrate 630' and can provide electrical contacts between RDS conductive structure 131 and electronic components 141 and 142. RDS bottom terminals 132 of RDS substrate 630' can be spaced away, omitted, or decoupled from base top terminals 113 of first base substrate 110 or second base substrate 510. In some examples, RDS substrate 630' can lack electrical connection from the bottom side of RDS substrate 630' to first base substrate 110 or second base substrate 510. RDS substrate 630' can couple with first base substrate 110 through first component terminals 1411A and 1411B of first electronic component 141. RDS substrate 630 can couple with to second base substrate 510 through second component terminals 1421A and 1421B of second electronic component 142. Dielectric layer 614 can be positioned beneath the bottom side of RDS substrate 630' and can isolate it from first base substrate 110 and second base substrate 510.

In some examples, the bottom side of RDS substrate 630' can comprise foundation layer 635 fully covering the bottom footprint of RDS substrate 630' from first base substrate 110, second base substrate 510, or encapsulant 120. Foundation layer 635 can comprise a dielectric, such as glass, or a semiconductor, such as silicon. In some examples, foundation layer 635 can comprise a remaining portion of a carrier or substrate on which RDS substrate 630 was formed.

The present disclosure includes reference to certain examples, it will be understood by those skilled in the art, however, that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor device, comprising:
 a first base substrate comprising a first base conductive structure;
 a first encapsulant contacting a lateral side of the first base substrate;
 a redistribution structure (RDS) substrate over the first base substrate and comprising an RDS conductive structure coupled with the first base conductive structure;
 a first electronic component over the RDS substrate and over a first component terminal coupled with the RDS conductive structure;
 a second encapsulant over the RDS substrate and contacting a lateral side of the first electronic component;
 wherein the first base substrate comprises:
  a base dielectric structure; and
  an embedded electrical component in the base dielectric structure;
 a second electronic component over the RDS substrate and over a second component terminal coupled with the RDS conductive structure; and
 a second base substrate laterally adjacent to the first base substrate and comprising a second base conductive structure;
 wherein the first encapsulant contacts a lateral side of the second base substrate; and
 wherein the second electronic component is coupled over the second base substrate.

2. The semiconductor device of claim 1, wherein:
the first encapsulant further contacts a top side of the first base substrate.

3. The semiconductor device of claim 1, wherein the first base substrate comprises a coreless substrate.

4. The semiconductor device of claim 1, wherein the second electronic component also is coupled over the first base substrate.

5. The semiconductor device of claim 4, further comprising:
 a third electronic component over the RDS substrate and over a third component terminal coupled with the RDS conductive structure;
  wherein the third electronic component is coupled over the second base substrate.

6. The semiconductor device of claim 1, wherein the RDS substrate covers an entire top side of the first base substrate.

7. A semiconductor device, comprising:
a first base substrate;
a first encapsulant contacting a lateral side of the first base substrate;
a redistribution structure (RDS) substrate over the first base substrate and comprising an RDS conductive structure;
a first electronic component over the RDS substrate and over a first component terminal coupled with the RDS conductive structure;
a second electronic component over the RDS substrate and over a second component terminal coupled with the RDS conductive structure;
a second encapsulant over the RDS conductive structure and contacting a lateral side of the first electronic component and the second electronic component; and
a second base substrate;
wherein the first base substrate comprises a first base conductive structure coupled with an additional first component terminal; and
wherein the second base substrate comprises a second base conductive structure coupled with an additional second component terminal.

8. The semiconductor device of claim 7, wherein a bottom side of the RDS substrate lacks RDS bottom terminals facing the first base substrate.

9. The semiconductor device of claim 7, wherein a bottom side of the RDS substrate comprises a foundation layer positioned over the first base substrate and the first encapsulant.

10. The semiconductor device of claim 7, wherein the first base conductive structure is coupled with the RDS conductive structure and the second base conductive structure is coupled with the RDS conductive structure.

11. The semiconductor device of claim 7, wherein the RDS substrate:
only partially overlaps a footprint of the first electronic component, and
only partially overlaps a footprint of the second electronic component.

12. The semiconductor device of claim 7, wherein:
the first electronic component is over a plurality of first component terminals coupled with the RDS conductive structure; and
the first electronic component is over a plurality of additional first component terminals coupled with the first base conductive structure.

13. The semiconductor device of claim 12, wherein:
the plurality of first component terminals are spaced at a first pitch; and
the plurality of additional first component terminals are spaced at a second pitch that is greater than the first pitch.

14. A semiconductor device, comprising:
a first base substrate;
a first encapsulant contacting a lateral side of the first base substrate;
a redistribution structure (RDS) substrate over the first base substrate and comprising an RDS conductive structure;
a first electronic component over the RDS substrate and over a first component terminal coupled with the RDS conductive structure;
a second electronic component over the RDS substrate and over a second component terminal coupled with the RDS conductive structure; and
a second encapsulant over the RDS conductive structure and contacting a lateral side of the first electronic component and the second electronic component; and
wherein:
(a) a bottom side of the RDS substrate lacks RDS bottom terminals facing the first base substrate; or
(b) a bottom side of the RDS substrate comprises a foundation layer positioned over the first base substrate and the first encapsulant.

15. The semiconductor device of claim 14, wherein:
the bottom side of the RDS substrate lacks RDS bottom terminals facing the first base substrate.

16. The semiconductor device of claim 14, wherein:
the bottom side of the RDS substrate comprises a foundation layer positioned over the first base substrate and the first encapsulant.

* * * * *